United States Patent
Higashi et al.

(10) Patent No.: US 9,343,576 B2
(45) Date of Patent: May 17, 2016

(54) THIN FILM FORMING METHOD, SEMICONDUCTOR SUBSTRATE AND ELECTRONIC DEVICE PRODUCED BY EMPLOYING SAME

(71) Applicant: HIROSHIMA UNIVERSITY, Hiroshima (JP)

(72) Inventors: Seiichiro Higashi, Hiroshima (JP); Kohei Sakaike, Hiroshima (JP); Yoshitaka Kobayashi, Hiroshima (JP); Shogo Nakamura, Hiroshima (JP); Muneki Akazawa, Hiroshima (JP)

(73) Assignee: Hiroshima University, Hiroshima (JP)

( * ) Notice: Subject to any disclaimer, the term of this patent is extended or adjusted under 35 U.S.C. 154(b) by 0 days.

(21) Appl. No.: 14/821,087

(22) Filed: Aug. 7, 2015

(65) Prior Publication Data

US 2015/0349137 A1    Dec. 3, 2015

Related U.S. Application Data

(63) Continuation of application No. PCT/JP2014/000560, filed on Feb. 4, 2014.

(30) Foreign Application Priority Data

Feb. 13, 2013 (JP) .................................. 2013-025445
Aug. 29, 2013 (JP) .................................. 2013-177888

(51) Int. Cl.
*H01L 21/30* (2006.01)
*H01L 21/46* (2006.01)
(Continued)

(52) U.S. Cl.
CPC ...... *H01L 29/78603* (2013.01); *H01L 21/2007* (2013.01); *H01L 21/76251* (2013.01);
(Continued)

(58) Field of Classification Search
CPC .................. H01L 21/76254; H01L 21/76251; H01L 21/2007; H01L 2924/01079; H01L 23/10; H01L 27/1214

USPC .................................. 438/455, 456, 458, 459
See application file for complete search history.

(56) References Cited

U.S. PATENT DOCUMENTS 5,710,057 A    1/1998  Kenney
2005/0233504 A1*  10/2005  Doi ..................... H01L 21/6835
                                                   438/127
(Continued)

FOREIGN PATENT DOCUMENTS

EP         0 989 593 A2    3/2000
JP       2000-091604 A     3/2000
(Continued)

OTHER PUBLICATIONS

International Search Report for corresponding International Application No. PCT/JP2014/000560 mailed Apr. 1, 2014.
(Continued)

*Primary Examiner* — Hsien Ming Lee
(74) *Attorney, Agent, or Firm* — Renner, Otto, Boisselle & Sklar, LLP

(57) ABSTRACT

The present invention provides a thin film forming method. The method includes the steps of: providing a first substrate, of which a surface is covered with a thin film; forming a plurality of openings through the thin film; forming a hollow portion between the first substrate and the thin film by etching the first substrate through the openings; bringing the thin film into contact with a second substrate with a liquid interposed between the thin film and the second substrate; and heating the first substrate and/or the second substrate. In the step of heating, the liquid interposed between the thin film and the second substrate evaporates off, which results in that the thin film is separated from the first substrate and transferred onto the second substrate.

22 Claims, 33 Drawing Sheets

(51) Int. Cl.
    *H01L 29/786* (2006.01)
    *H01L 29/66* (2006.01)
    *H01L 27/12* (2006.01)
    *H01L 31/18* (2006.01)
    *H01L 31/0445* (2014.01)
    *H01L 21/762* (2006.01)
    *H01L 21/20* (2006.01)
    *H01L 31/0352* (2006.01)
    *H01L 31/068* (2012.01)

(52) U.S. Cl.
    CPC ........ *H01L27/1222* (2013.01); *H01L 27/1266* (2013.01); *H01L 29/66772* (2013.01); *H01L 29/78654* (2013.01); *H01L 31/03529* (2013.01); *H01L 31/0445* (2014.12); *H01L 31/068* (2013.01); *H01L 31/0682* (2013.01); *H01L 31/1804* (2013.01); *H01L 31/1892* (2013.01); *Y02E 10/547* (2013.01); *Y10T 428/24331* (2015.01)

(56) References Cited

U.S. PATENT DOCUMENTS

| | | |
|---|---|---|
| 2006/0134893 A1 | 6/2006 | Savage et al. |
| 2007/0032089 A1 | 2/2007 | Nuzzo et al. |
| 2010/0224915 A1 | 9/2010 | Kawashima et al. |
| 2013/0089933 A1* | 4/2013 | Suga ................... H01L 27/1214 438/4 |

FOREIGN PATENT DOCUMENTS

| | | |
|---|---|---|
| JP | 2000-188269 A | 7/2000 |
| JP | 2008-525998 A | 7/2008 |
| JP | 2009-508322 A | 2/2009 |
| WO | WO 2007/083570 A1 | 7/2007 |

OTHER PUBLICATIONS

Form PCT/ISA/237 for corresponding International Application No. PCT/JP2014/000560 dated Apr. 1, 2014.

* cited by examiner

THIN FILM FORMING METHOD, SEMICONDUCTOR SUBSTRATE AND ELECTRONIC DEVICE PRODUCED BY EMPLOYING SAME

CROSS-REFERENCE TO RELATED APPLICATION

This is a continuation of International Application No. PCT/JP2014/000560 filed on Feb. 4, 2014, which claims priority to Japanese Patent Application No. 2013-025445 filed on Feb. 13, 2013 and Japanese Patent Application No. 2013-177888 filed on Aug. 29, 2013. The entire disclosures of these applications are incorporated by reference herein.

BACKGROUND

The present invention relates to a thin film forming method. The present invention also relates to a semiconductor substrate and an electronic device which are produced by employing the method.

The performance of a thin film transistor, a solar cell, and other types of electronic devices is dependent on the crystallinity of a silicon thin film formed on a quartz substrate, a glass substrate, or a flexible substrate included therein. Therefore, intensive researches have been conducted to develop techniques to improve the crystallinity of silicon thin films formed on quartz, glass, and flexible substrates.

Laser annealing has been known as a representative method for forming a polysilicon film on quartz, glass, and flexible substrates (see Japanese Unexamined Patent Publication No. 2000-91604).

SUMMARY

Due to improvement of the techniques to form a silicon film on quartz, glass, and flexible substrates, silicon films having high crystallinity are now provided. However, it is still considered difficult to form a monocrystalline silicon film on a quartz substrate, a glass substrate, or a flexible substrate.

In view of the foregoing background, it is therefore a main object of the present invention to provide a method for forming a thin film such as a monocrystalline semiconductor film on a substrate such as a quartz substrate, a glass substrate, and a flexible substrate, as well as to provide a semiconductor substrate and an electronic device which are produced by the method.

A thin film forming method according to an embodiment of the present invention includes the steps of: providing a first substrate, of which a surface is covered with a thin film; forming a plurality of openings through the thin film; forming a hollow portion between the first substrate and the thin film by etching the first substrate through the openings; bringing the thin film into contact with a second substrate with a liquid interposed between the thin film and the second substrate; and heating the first substrate and/or the second substrate, wherein in the step of heating, the liquid interposed between the thin film and the second substrate evaporates off, which results in that the thin film is separated from the first substrate and transferred onto the second substrate.

In a preferred embodiment, the thin film and the first substrate sandwich therebetween a sacrificial layer. In the step of forming the hollow portion, not the first substrate but the sacrificial layer is etched, and in the step of heating, the thin film is separated from the sacrificial layer and transferred onto the second substrate.

A semiconductor substrate according to an embodiment of the present invention includes a semiconductor thin film transferred onto a surface thereof by the above thin film forming method.

An electronic device according to an embodiment of the present invention includes a semiconductor thin film transferred onto a substrate surface by the above thin film forming method.

A method for making a thin film transistor according to an embodiment of the present invention includes the steps of: providing a first substrate, of which a surface is covered with a semiconductor thin film with an insulating layer sandwiched between the first substrate and the semiconductor thin film; patterning the semiconductor thin film into regions to serve as a channel region and source/drain regions; forming a plurality of openings through the regions of the semiconductor thin film to serve as the source/drain regions; forming a hollow portion between the first substrate and the semiconductor thin film by etching the insulating layer through the openings; bringing the semiconductor thin film into contact with a second substrate with a liquid interposed between the semiconductor thin film and the second substrate; and heating the first substrate and/or the second substrate, wherein in the step of heating, the liquid interposed between the semiconductor thin film and the second substrate evaporates off, which results in that a pattern of the semiconductor thin film is separated from the insulating layer and transferred onto the second substrate.

In a preferred embodiment, in the step of pattering the semiconductor thin film, the channel region comprises a plurality of channel regions, the source/drain region comprises a plurality of source/drain regions, and the channel regions and the source/drain regions are arranged in a matrix.

A method for producing a solar cell according to an embodiment of the present invention includes the steps of: providing a second substrate which has a transparent electrode formed on a surface thereof; and by the above thin film forming method, transferring a first conductivity type semiconductor thin film and a second conductivity type semiconductor thin film in this order from the first substrate onto the second substrate; wherein in the step of transferring, a PN junction is formed by the semiconductor thin films on the transparent electrode.

The present invention provides a method for forming a thin film such as a monocrystalline semiconductor film on a substrate such as a quartz substrate, a glass substrate, and a flexible substrate. The present invention also provides a semiconductor substrate and an electronic device which are produced by the method.

DETAILED DESCRIPTION

The present inventors disclose, in the specification of Japanese Patent Application No. 2011-176335, a technique to transfer an amorphous silicon film formed on a quartz substrate that is a donor substrate onto a receiver substrate (a glass substrate or a flexible substrate) while crystallizing the amorphous silicon film. Specifically, this transfer technique is carried out as follows: First of all, openings are formed through the amorphous silicon film, and the quartz substrate is etched through these openings, thereby making the amorphous silicon film have a suspended structure supported by quartz pillars. Thereafter, the amorphous silicon film is brought into contact with the receiver substrate and then is irradiated with a laser beam coming in through the quartz substrate. In this manner, the amorphous silicon film is melted, and then recrystallized. Since the chemical bond between the recrystallized silicon film and the receiver substrate is strong, the recrystallized silicon film is transferred onto the receiver substrate successfully.

This transfer technique enables formation of a large-area silicon film having good crystallinity on a glass substrate or a flexible substrate, and is expected to contribute to providing high-performance electronic devices such as liquid crystal panels and solar cells.

The implementation of this transfer technique, however, requires a technique to melt and recrystallize an amorphous silicon film. Therefore, this transfer technique still has some problems to transfer of such a large-area monocrystalline silicon film onto a receiver substrate successfully.

In view of the forgoing, the present inventors focused our attention on a monocrystalline silicon film formed on a silicon on insulator (SOI) substrate, studied a technique to transfer such a monocrystalline silicon film onto a substrate such as a quartz substrate, a glass substrate, and a flexible substrate, and thereby perfected the present invention.

Embodiments of the present invention will be described below in detail with reference to the drawings. Note that the present invention is not limited to the following embodiments. Various changes and modifications may be made without departing from the scope of the present invention.

First Embodiment

FIGS. 1A to 1D, 2A and 2B show respective process steps of a thin film forming method according to a first embodiment of the present invention.

Figure 1A:
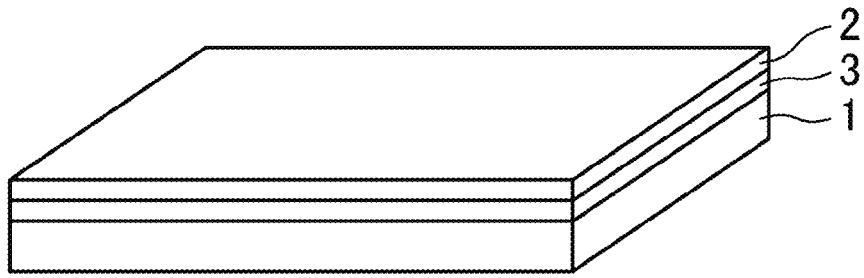
FIGS. 1A to 1D show respective process steps of a thin film forming method according to a first embodiment of the present invention.

First, as shown in FIG. 1A, a first substrate 1 is provided. The first substrate 1 has its surface covered with a thin film 2 with a sacrificial layer 3 sandwiched between the substrate 1 and the film 2. As such a substrate, an SOI substrate may be used, for example. In this example, the first substrate 1, the thin film 2, and the sacrificial layer 3 are configured as a monocrystalline silicon substrate, a monocrystalline silicon film, and a silicon dioxide film, respectively.

Figure 1B:
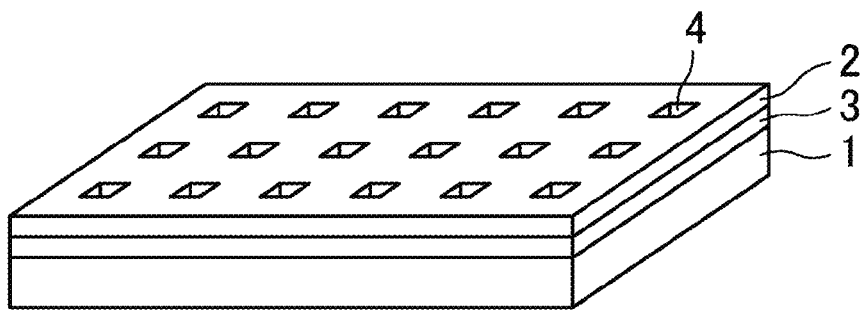

Next, as shown in FIG. 1B, a plurality of openings 4 are formed through the thin film 2. For example, the openings 4 may be formed by etching through a photolithographic process.

Figure 1C:
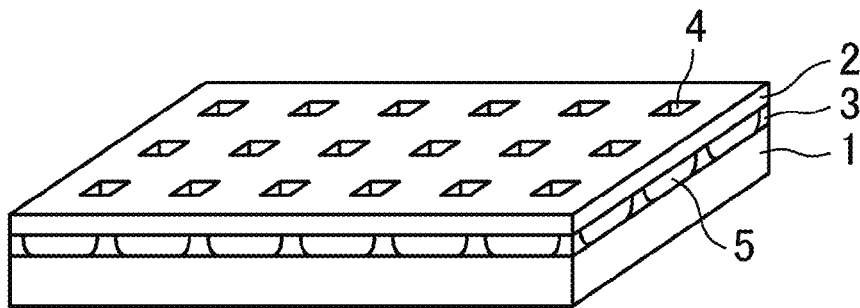

Next, as shown in FIG. 1C, the sacrificial layer 3 is etched through the openings 4 so as to form a hollow portion 5 between the first substrate 1 and the thin film 2. For example, if the sacrificial layer 3 is a silicon dioxide film, the sacrificial layer 3 may be etched with hydrofluoric acid. It is preferable that this etching process be performed using an etchant having a high etch selectivity between the thin film 2 and the first substrate 1.

Figure 1D:
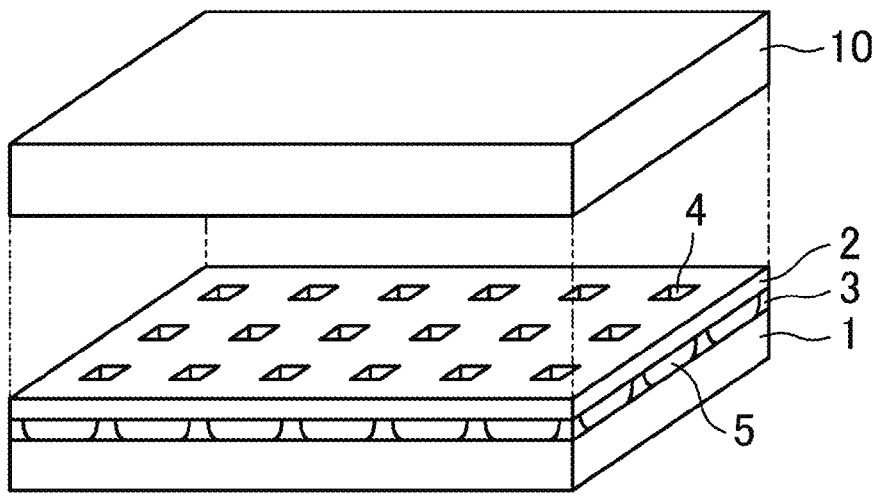

Thereafter, as shown in FIG. 1D, the thin film 2 is brought into contact with a second substrate 10 with a liquid (not shown) interposed between the thin film 2 and the second substrate 10. At this time, while the liquid is present between the thin film 2 and the second substrate 10, the openings 4 and the hollow portion 5 are also filled with the liquid. As the second substrate 10, a quartz substrate, a glass substrate, or a flexible substrate may be used, for example. As the liquid, water, ethanol, or acetone may be used, for example. In particular, a liquid which has a great surface tension (e.g., water) is preferred.

Figure 2A:
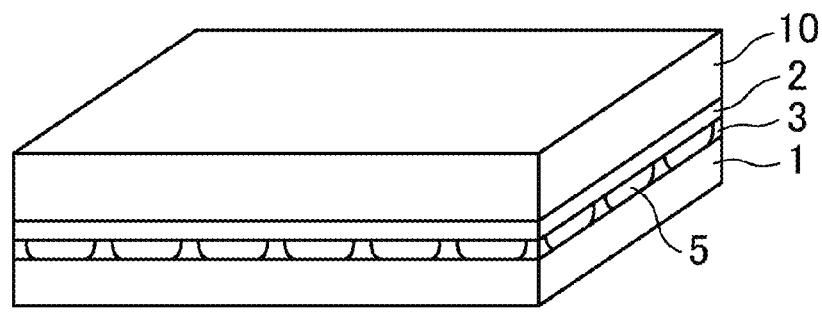
FIGS. 2A and 2B show respective process steps of the thin film forming method according to the first embodiment of the present invention.

Next, as shown in FIG. 2A, the first substrate 1 and/or the second substrate 10 are/is heated. This heating process is carried out at a temperature lower than the boiling point of the liquid. In this heating process, a halogen lamp or a hot plate may be used, for example. This heating process is performed to evaporate the liquid which is interposed between the thin film 2 and the second substrate 10 and with which the openings 4 and the hollow portion 5 are filled. Therefore, not both of the first substrate 1 and the second substrate 10 have to be directly heated. Rather, the heating process may be carried out in such a manner that one of these substrates is directly heated and the other is indirectly heated, for example.

Figure 2B:
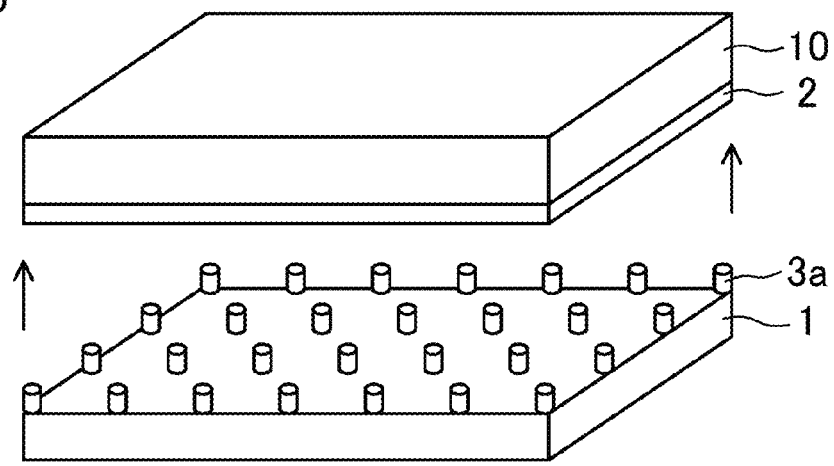

As shown in FIG. 2B, as a result of this heating process step, the liquid interposed between the thin film 2 and the second substrate 10 evaporates off, which results in separation of the thin film 2 from the first substrate 1. Consequently, upon lifting the second substrate 10, the thin film 2 is transferred onto the second substrate 10. At this time, the thin film 2 transferred onto the second substrate 10 maintains its pattern with the openings 4. On the surface of the first substrate 1, pillars 3a that constituted part of the sacrificial layer 3 are left.

As can be seen from the forgoing, according to the thin film forming method of this embodiment, the thin film 2 formed on the first substrate 1 is transferred as it is onto the second substrate 10. Therefore, if the thin film 2 is a monocrystalline film, the monocrystalline film is transferred as it is onto the second substrate 10. Thus, this method allows for forming a monocrystalline semiconductor thin film on a substrate such as a quartz substrate, a glass substrate, and a flexible substrate.

Next, a process for forming the hollow portion 5 will be described with reference to FIGS. 3A to 3C and 4A to 4C.

Figure 3A:
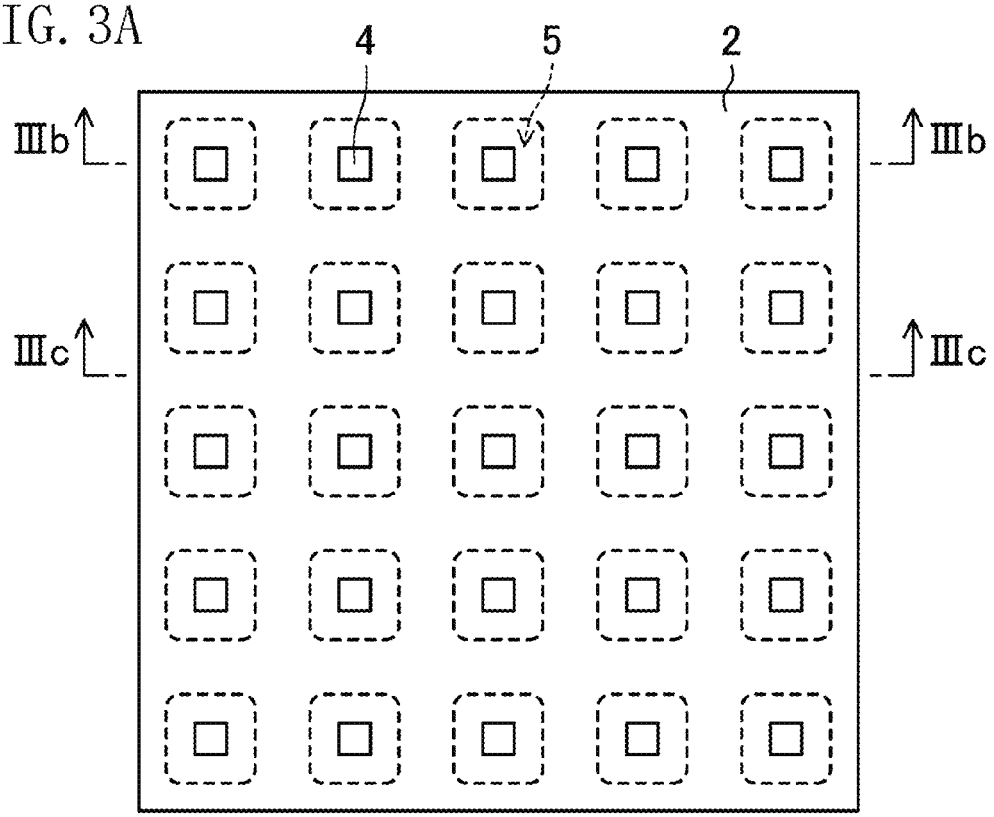
FIGS. 3A to 3C show how to form a hollow portion.

FIG. 3A is a plan view showing the thin film 2 through which the openings 4 have been formed. As shown in FIG. 3A, the openings 4 are arranged in an array. An etchant for etching the sacrificial layer 3 is supplied through the openings 4, and the sacrificial layer 3 is isotropically etched. The etching process progresses to penetrate the sacrificial layer 3 in the thickness direction. When the sacrificial layer 3 is etched to the bottom, the etching process changes direction and further progresses in all directions parallel to the surface of the sacrificial layer 3. Each of the dotted lines in FIG. 3A represents one of the boundaries of the sacrificial layer 3 when the etching has progressed outward from an associated one of the openings 4 in all directions parallel to the surface of the sacrificial layer 3.

Figure 3B:
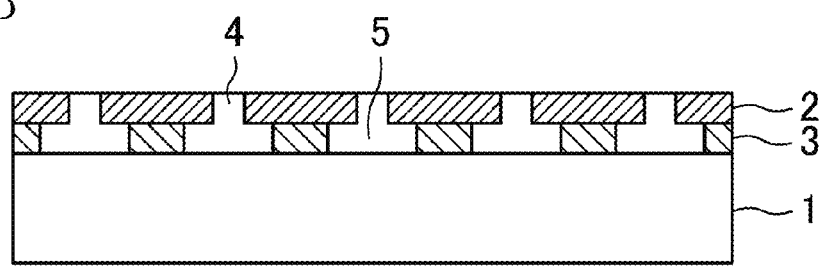
Figure 3C:
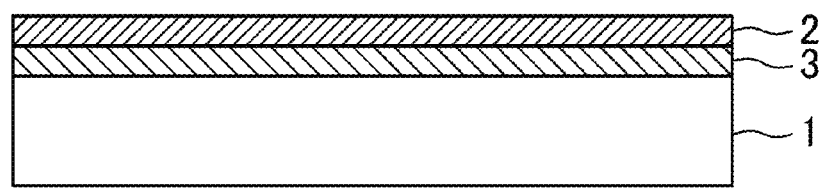

FIGS. 3B and 3C are cross-sectional views showing this state, and taken along the planes IIIb-IIIb and IIIc-IIIc shown in FIG. 3A, respectively. In this state, as shown in FIG. 3B, the hollow portion 5 has been partially formed between the first substrate 1 and the thin film 2 in the plane IIIb-IIIb. On the other hand, as shown in FIG. 3C, the hollow portion 5 has not been formed yet in the plane IIIc-IIIc.

Figure 4A:
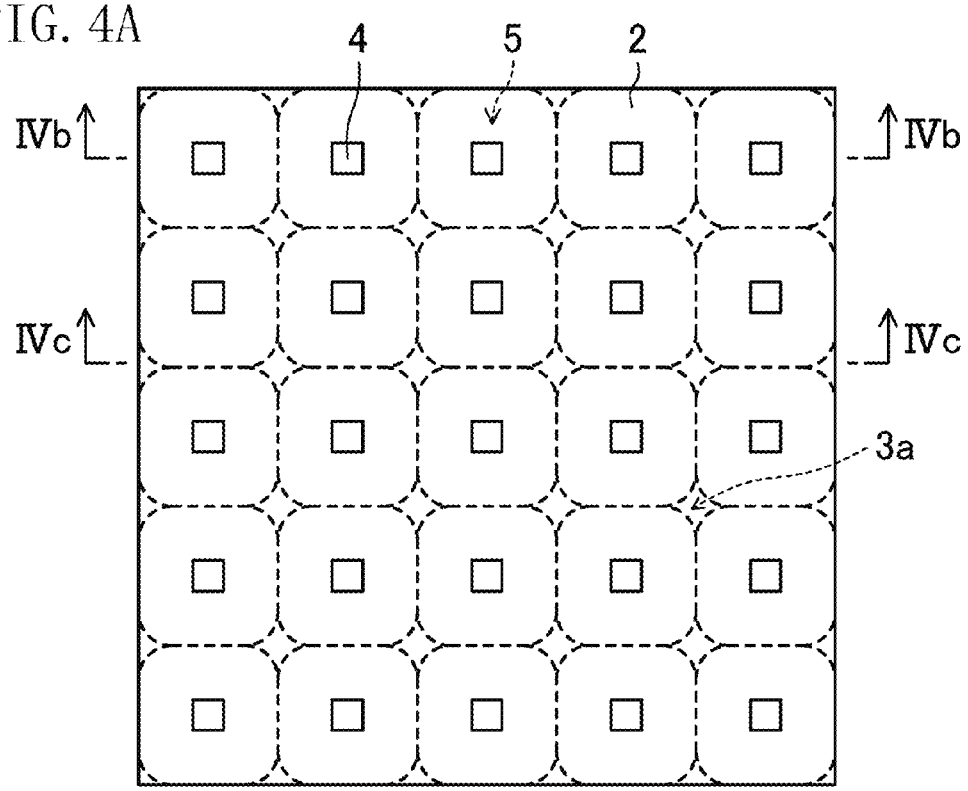
FIGS. 4A to 4C show how to form a hollow portion.

When the etching process further progresses, as shown in FIG. 4A, in the plane IVb-IVb, the sacrificial layer 3 between the first substrate 1 and the thin film 2 will have been completely etched away, and only the hollow portion 5 will be left. On the other hand, as shown in FIG. 4C, in the plane IVc-IVc, the pillars 3a that constituted part of the sacrificial layer 3 will be left. As a result, as shown in FIG. 4A, the thin film 2 will have a suspended structure supported by the pillars 3a arranged in an array.

Here, the etching of the sacrificial layer 3 is controlled by regulating the etching time such that the pillars 3a will have an appropriate size for the transfer, as will be described later. Since the pillars 3a are formed by etching the sacrificial layer 3 in the directions parallel to its surface, the pillars 3a are made to have a predetermined size in a well-controlled manner.

Next, with reference to FIGS. 5A to 5C and 6A to 6C, a transfer mechanism according to the present invention will be described below.

Figure 5A:
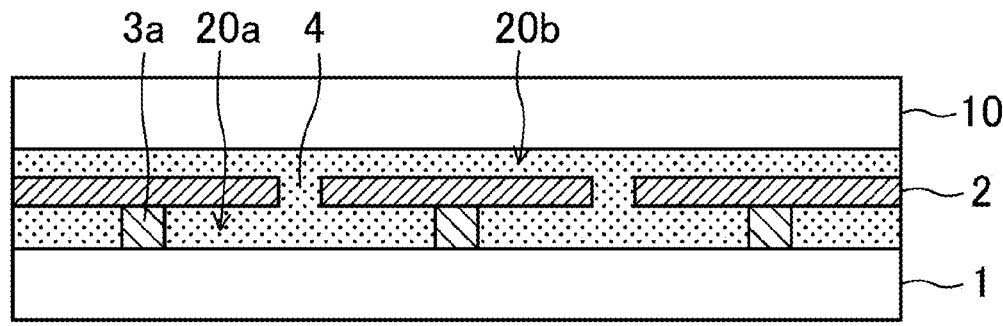
FIGS. 5A to 5C show a transfer mechanism according to the present invention.

FIG. 5A is a cross-sectional view showing the state shown in FIG. 2A, where the thin film 2 has been brought into contact with the second substrate 10 with a portion 20b of the liquid interposed between the film 2 and the substrate 10. In this state, the openings 4 and the hollow portion 5 are also filled with a portion 20a of the liquid.

Figure 4B:
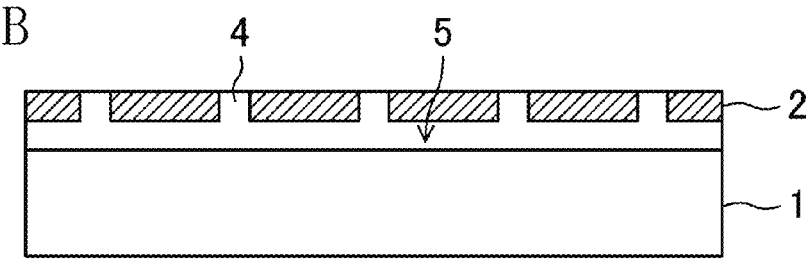
Figure 4C:
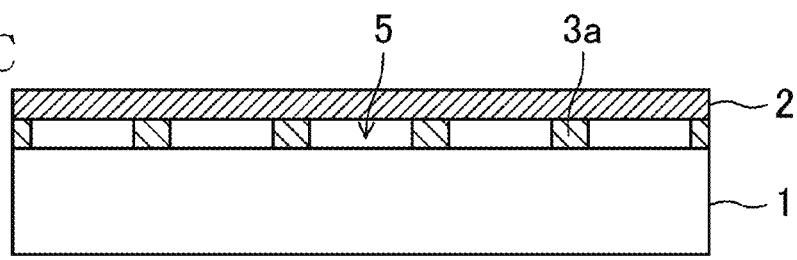

For the sake of convenience, FIG. 5A shows, in the same cross section, the openings 4 shown in FIG. 4B and the pillars 3a shown in FIG. 4C. Further, the portion 20b of the liquid interposed between the thin film 2 and the second substrate 10 is illustrated in FIG. 5A thicker than the actual one.

Figure 5B:
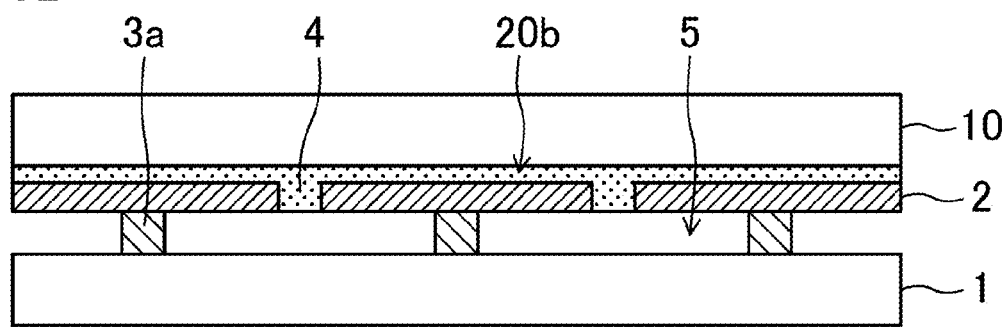

Next, as shown in FIG. 5B, when the first substrate 1 and/or the second substrate 10 are/is heated, the portion 20a of the liquid, with which the hollow portion 5 that communicates with the outside and the openings 4 have been filled, evaporates off first. Thereafter, when the evaporation further progresses, only the portion 20b of the liquid interposed between the thin film 2 and the second substrate 10 will be left, as shown in FIG. 5C.

Figure 5C:
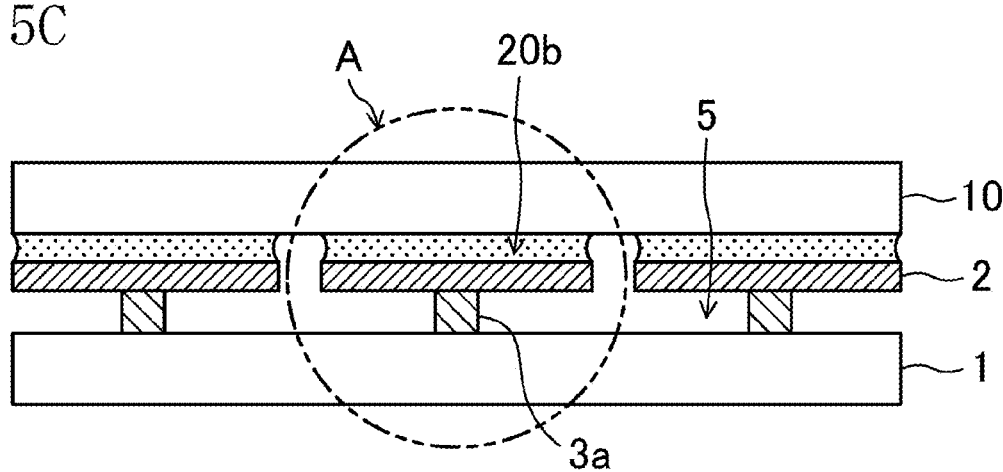
Figure 6A:
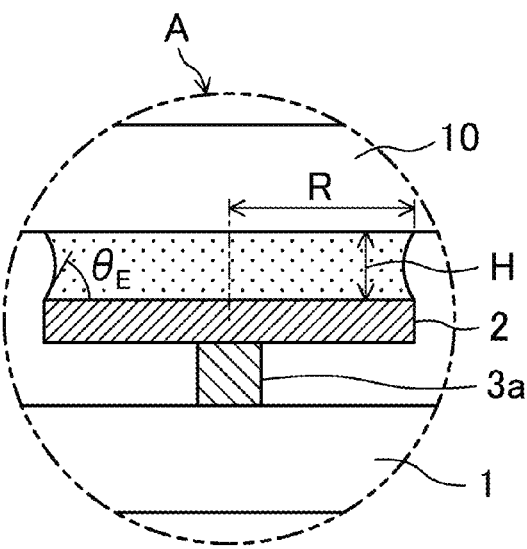
FIGS. 6A to 6C show the transfer mechanism of the present invention.

FIG. 6A is a cross-sectional view illustrating, on a larger scale, the encircled region A shown in FIG. 5C. The portion 20b of the liquid interposed between the thin film 2 and the second substrate 10 forms a capillary bridge, and a capillary adhesion force (a meniscus force) is acting on the thin film 2 supported by the associated pillar 3a. The magnitude of this capillary adhesion force is dependent on the height H of the portion 20b of the liquid (the height of the capillary bridge), the contact area and the contact angle $\theta_E$ between the thin film 2 and the portion 20b of the liquid.

Figure 7:
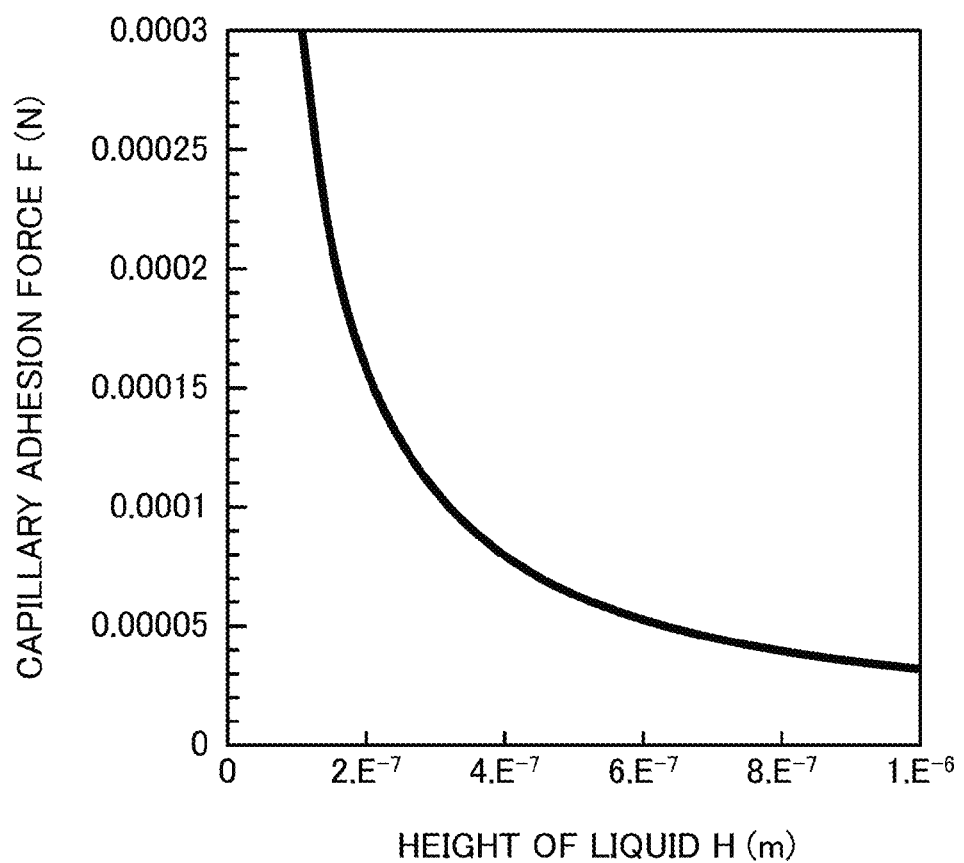
FIG. 7 is a graph showing a relation between the capillary adhesion force and the height of a liquid.

FIG. 7 is a graph showing the magnitude of the capillary adhesion force that was calculated by simulation relative to the height H of the portion 20b of the liquid. The simulation was performed on the supposition that water was used as the liquid, the contact area between the thin film 2 and the portion 20b of the liquid (i.e., the area supported by one pillar 3a) was set to be 9 µm×9 µm, and the contact angle $\theta_E$ was set to be 30°. Here, the magnitude of the capillary adhesion force was calculated in the following manner (see "Hyoumen chouryoku no butsurigaku" translated by Kou Okumura, Second Ed., pp. 6-9, (2008) [Original Title: Capillarity and Wetting Phenomena: Drops, Bubbles, Pearls, Waves, written by Pierre-Gilles de Gennes, Francoise Brochard-Wyart, and David Quere]).

A liquid injected in a gap with a height H between two substrates takes on the form of a so-called "capillary bridge". Here, if the radius of the capillary bridge is denoted by R, Laplace pressure $\Delta p$ in the liquid is given by the following equation:

$$\Delta p = \gamma \left( \frac{1}{R} - \frac{\cos\theta_E}{H/2} \right) \approx -\frac{2\gamma\cos\theta_E}{H} \quad \text{[Equation 1]}$$

If $\theta_E < \pi/2$ is satisfied, the adhesion force on the substrate, i.e., the capillary adhesion force F, acts as an attractive force, and is represented by the following equation:

$$F = \pi R^2 \Delta P + 2\pi R\gamma \sin\theta_E \approx \frac{\pi R^2 2\gamma\cos\theta_E}{H} \quad (H \ll R) \quad \text{[Equation 2]}$$

Figure 6B:
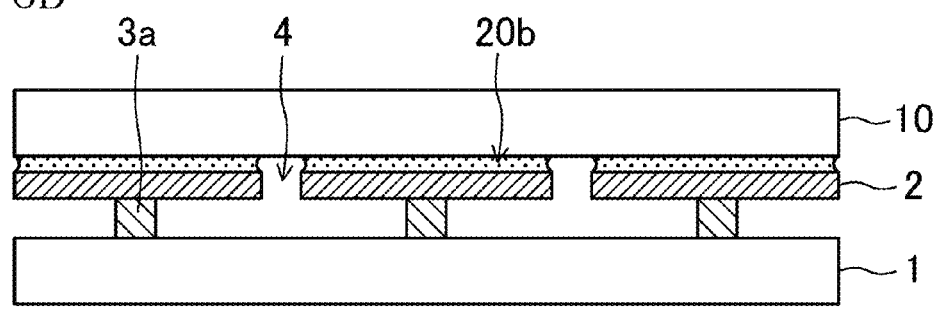
Figure 6C:
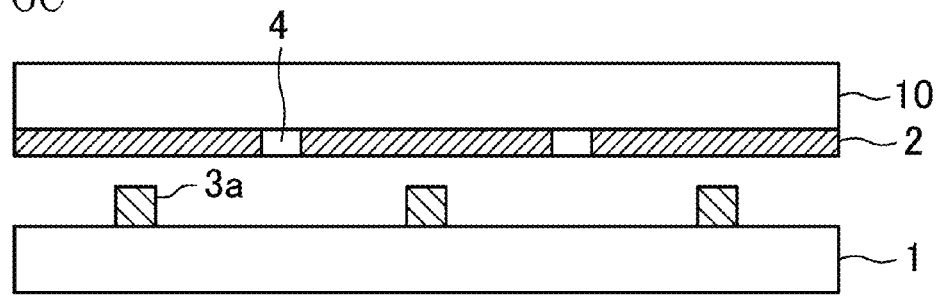

As can be seen from FIG. 7, as the height H of the portion 20b of the liquid decreases, the capillary adhesion force F sharply increases. Thus, as shown in FIG. 6B, when the evaporation of the portion 20b of the liquid progresses to make the height H of the portion 20b smaller than a predetermined value, the capillary adhesion force F becomes greater than the bonding force between the thin film 2 and the pillars 3a. Consequently, as shown in FIG. 6C, when the portion 20b of the liquid interposed between the thin film 2 and the second substrate 10 evaporates completely, the thin film 2 is separated from the pillars 3a and transferred onto the second substrate 10.

The capillary adhesion force F is dependent on the contact area between the thin film 2 and the portion 20b of the liquid, whereas the bonding strength between the thin film 2 and the pillars 3a is dependent on the contact area between the thin film 2 and the pillars 3a. For example, if the hollow portion 5 is formed as shown in FIGS. 3 and 4, the pillars 3a are arranged in an array at the same intervals as the openings 4. In this case, a portion of the thin film 2 which is defined by four openings 4 arranged in a two-by-two array is supported by an associated one of the pillars 3a that is located at the center. Therefore, the area of the portion of the thin film 2 supported by the associated pillar 3a, i.e., the contact area between the portion of the thin film 2 and the portion 20b of the liquid can be adjusted by varying the intervals between the openings 4. The contact area between the thin film 2 and the pillars 3a is also adjustable by varying the transverse cross-sectional area (the size) of each pillar 3a. Here, the transverse cross-sectional area of each pillar 3a is variable by adjusting the etch amount of the sacrificial layer 3 in the step of forming the hollow portion 5.

The liquid interposed between the thin film 2 and the second substrate 10 exerts the capillary adhesion force F when the contact angle $\theta_E$ formed between the thin film 2 and the liquid that is in contact with the film 2 is smaller than 90°, as shown in FIG. 6A. Therefore, it is more preferable that the second substrate 10 have an affinity for the liquid. If the second substrate 10 is made of a material which has no affinity for any liquid, it is preferable to subject the surface of the second substrate 10 to a surface treatment that imparts an affinity for a liquid to the surface of the second substrate 10.

The surface treatment to impart the affinity may be implemented by forming a thin film having polarity on the surface of the second substrate 10, for example. If the second substrate 10 is configured as a flexible substrate, the surface treatment may be implemented by applying chitosan to the surface of the substrate.

As can be seen from the foregoing, the transfer of the thin film 2 onto the second substrate 10 is achieved by utilizing the capillary adhesion force exerted by the portion 20b of the liquid interposed between the thin film 2 and the second substrate 10. Actually, however, the portion 20b of the liquid is not uniformly present between the thin film 2 and the second substrate 10. Consequently, the capillary adhesion force varies from location to another. Therefore, if the heating process to evaporate the portion 20b of the liquid is performed uniformly on the whole substrate(s), the transfer will progress in various directions, which may result in forming wrinkles in the thin film 2 transferred onto the second substrate 10.

Figure 8A:
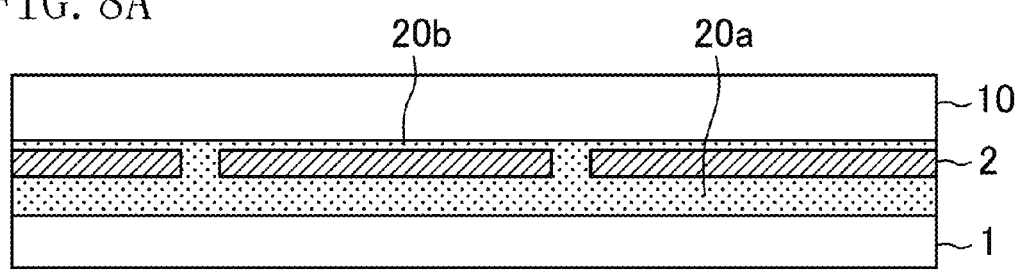
FIGS. 8A to 8C show respective process steps of a process for heating substrates.
Figure 8B:
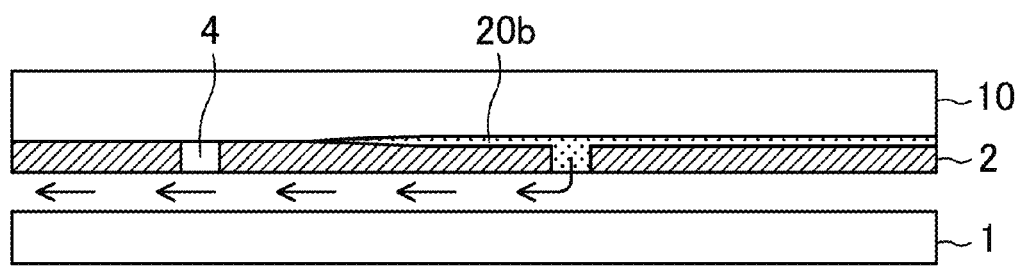
Figure 8C:
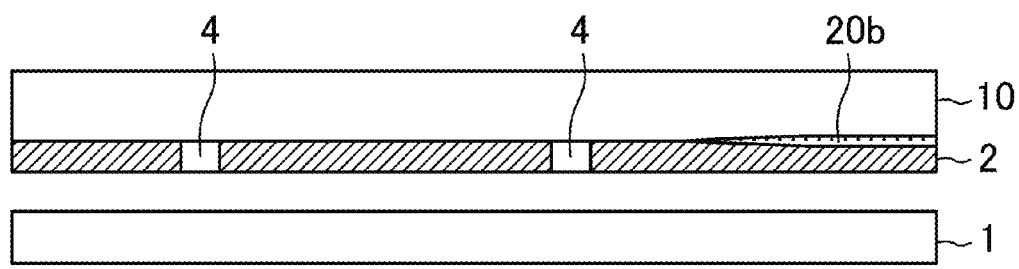

FIGS. 8A to 8C show respective process steps of a substrate heating process which can solve this problem.

FIG. 8A shows the same state as that of FIG. 5A. For the sake of convenience, the pillars 3a are not illustrated in FIG. 8A.

As shown in FIG. 8B, when the first substrate 1 and the second substrate 10 are heated such that the evaporation of the liquid progresses in one direction from an end portion of the substrates 1 and 10, the portion 20a of the liquid that is present in the hollow portion 5 between the first substrate 1 and the thin film 2 evaporates off first. Thereafter, the portion 20b of the liquid interposed between the thin film 2 and the second substrate 10 evaporates off from the vicinity of the end portion (shown at the left end in FIG. 8B) after having passed through the openings 4 and the hollow portion 5. As a result of the evaporation of the portion 20b of the liquid that was present in the vicinity of the end portion of the substrates 1 and 10 and between the thin film 2 and the second substrate 10, a corresponding region of the thin film 2 is separated from the associated pillar 3a (not shown) and transferred onto the second substrate 10. As the heating process progresses inward on the substrates 1 and 10 (i.e., toward the right end in FIG. 8B), the portion 20b of the liquid present in an even inner region between the thin film 2 and the second substrate 10 evaporates off, which results in that a corresponding region of the thin film 2 is separated from the associated pillar 3a (not shown) and transferred onto the second substrate 10, as shown in FIG. 8C.

As can be seen, by heating the first substrate 1 and the second substrate 10 such that the evaporation of the liquid progresses in one direction from the end portion of the substrates 1 and 10, the timing of the transfer is controllable, which consequently allows for transferring the thin film 2 onto the second substrate 10 without causing wrinkles in the thin film 2.

According to the transfer technique of the present invention, the thin film 2 is transferred onto the second substrate 10 by utilizing the difference between the capillary adhesion force that is exerted on the thin film 2 by the portion 20b of the liquid between the thin film 2 and the second substrate 10 and the bonding force between the thin film 2 and the pillars 3a. Therefore, to ensure that the thin film 2 is transferred onto the second substrate 10, some important parameters need to be controlled. Examples of those parameters include the amount of the liquid to be supplied between the thin film 2 and the second substrate 10, the heating temperature to evaporate the liquid, and the size of the pillars 3a that support thin film 2 having a suspended structure.

Figure 9:
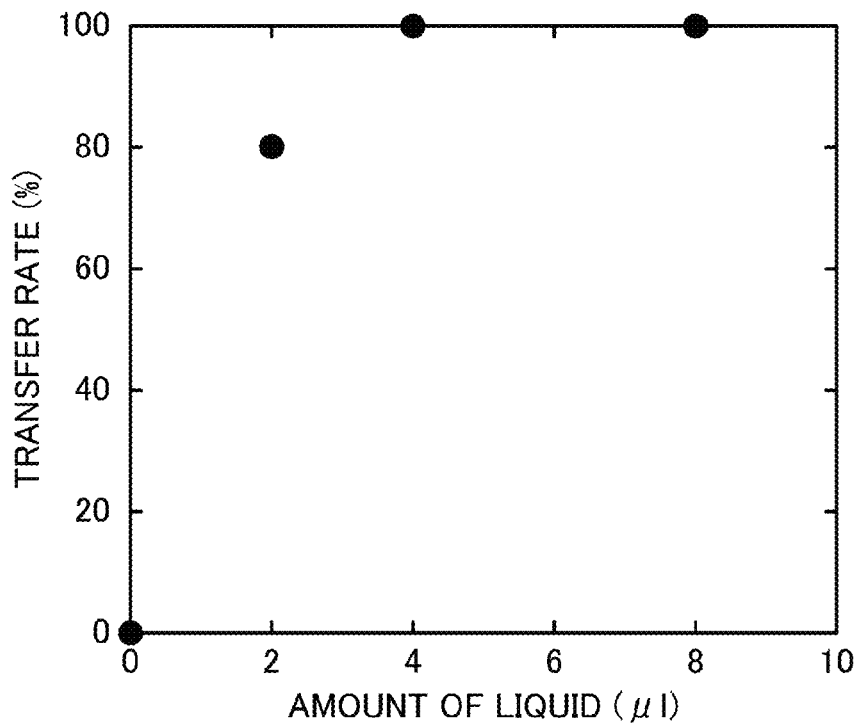
FIG. 9 is a graph showing a relation between the transfer rate and the amount of a liquid.
Figure 10:
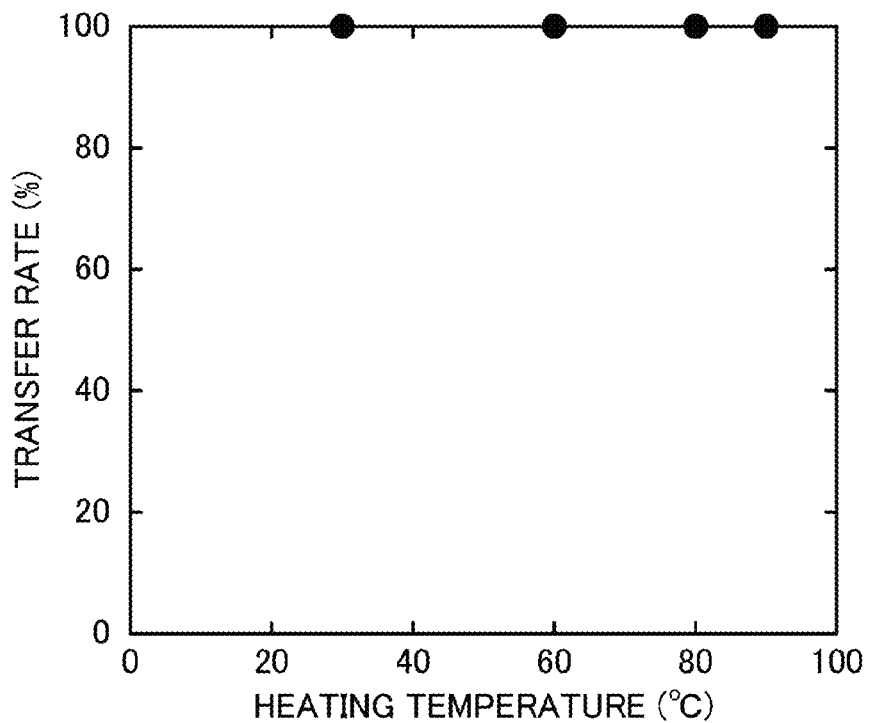
FIG. 10 is a graph showing a relation between the transfer rate and the heating temperature.
Figure 11:
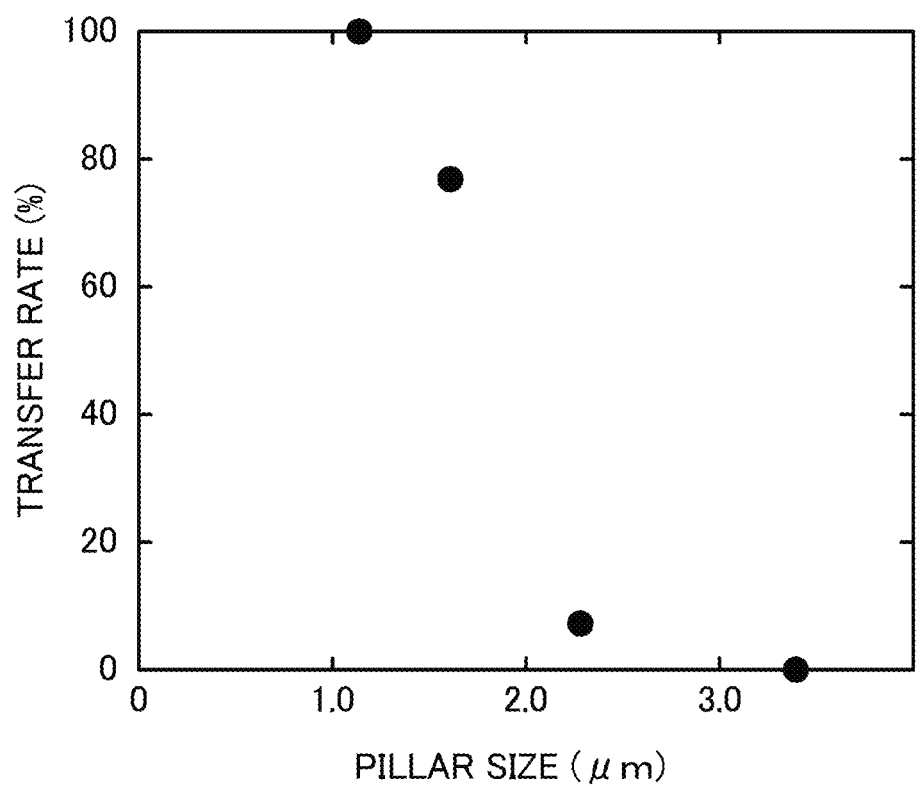
FIG. 11 is a graph showing a relation between the transfer rate and the pillar size.

FIGS. 9 to 11 are graphs showing how the transfer rate measured varied according to these parameters. In making the measurements, an SOI substrate was used as the first substrate 1. This SOI substrate included a silicon substrate, of which the surface was covered with a monocrystalline silicon thin film (having a thickness of 180 nm) with a silicon dioxide film (having a thickness of 500 nm) interposed between the silicon substrate and the monocrystalline silicon thin film. A polyethylene terephthalate (PET) substrate was used as the second substrate 10. Through the thin film (monocrystalline silicon film) 2, openings 4 each having a size of 2 μm×2 μm were formed so as to be arranged in an array at a pitch of 11 μm. The size of each of the pillars 3a to support the monocrystalline silicon film having a suspended structure was set to be 1 μm×1 μm. The suspended structure was formed in a region of 6 mm×6 mm on the first substrate 1. Water was used as the liquid. The transfer rates (%) were calculated by (Area of the transferred Si film)/(Area of the yet-to-be-transferred Si film)×100.

FIG. 9 shows how the transfer rate of the thin film 2 measured varied depending on the amount of the liquid (water) supplied between the thin film 2 and the second substrate 10. Here, the liquid (water) was supplied in the following manner: 2 μl to 8 μl of water was dropped from a pipette on the center of the region (having a size of 6 mm×6 mm) with the suspended structure, and thereafter, the donor substrate was brought into contact with the receiver substrate.

As shown in FIG. 9, a transfer rate of 100% is achieved irrespective of the amount of the liquid supplied as long as the amount of the liquid supplied is at least equal to a certain value (4 μl). The transfer rate decreased to be 80% when the amount of the liquid was 2 μl probably because the amount of the liquid supplied was so little that the liquid was absent in some regions between the thin film 2 and the second substrate 10. When no liquid was supplied, the transfer rate was 0%. This is because no capillary adhesion force acted to separate the thin film 2 from the pillars 3a due to the absence of the liquid between the thin film 2 and the second substrate 10.

FIG. 10 shows how the transfer rate of the thin film 2 measured varied depending on the heating temperature to evaporate the liquid (water) between the thin film 2 and the second substrate 10.

As shown in FIG. 10, as long as the heating temperature is 30° C. or more, a transfer rate of 100% is achieved. This means that the transfer rate does not depend on the rate of evaporation, but is determined by the capillary adhesion force that acts on the thin film 2. Heating at a temperature equal to or higher than the boiling point of the liquid (e.g., at 100° C. or more in the case of water) is not preferable because such heating prevents a quasi-static capillary adhesion force from acting on the thin film 2 and makes impossible a uniform transfer of the thin film 2.

FIG. 11 shows how the transfer rate of the thin film 2 measured varied depending on the size of the pillar 3a supporting the thin film 2.

As shown in FIG. 11, when the size of the pillar 3a was 1.2 μm×1.2 μm or less, the transfer rate of the thin film 2 was 100%. On the other hand, as the size of the pillar 3a increased, the transfer rate decreased. This result suggests that the transfer mechanism of the present invention works such that when the capillary adhesion force that is exerted on the thin film 2 by the portion 20b of the liquid between the thin film 2 and the second substrate 10 exceeds the bonding force between the thin film 2 and the pillars 3a, the thin film 2 is transferred onto the second substrate 10.

Note that the graphs of FIGS. 9 to 11 are shown for the purpose of providing guidelines on how to set those important parameters that contribute to a reliable transfer of the thin film 2 onto the second substrate 10. Therefore, the numerical values shown on the graphs are not absolute ones, but may vary depending on the configuration of the suspended structure, the materials of the substrates 1, 10, the thin film 2, and the sacrificial layer 3, and the kind of the liquid to be supplied.

Figure 12A:
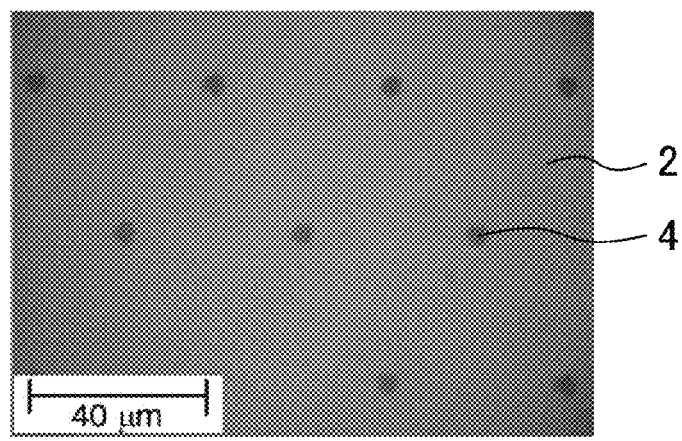
FIG. 12A is an optical micrograph showing a surface of a yet-to-be-transferred thin film.
Figure 12B:
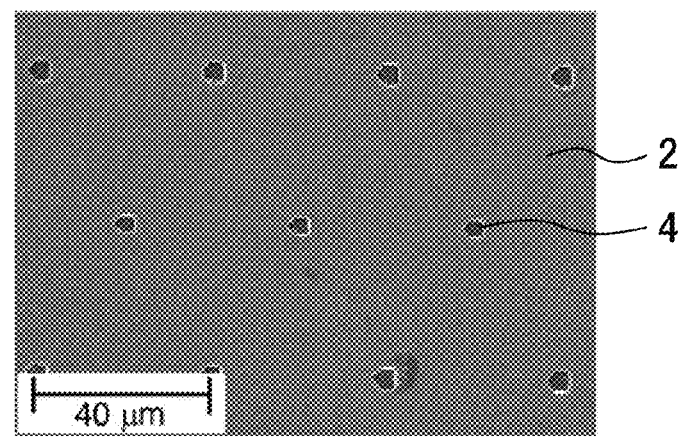
FIG. 12B is a scanning electron microscope (SEM) photograph showing the surface of the transferred thin film.
Figure 12C:
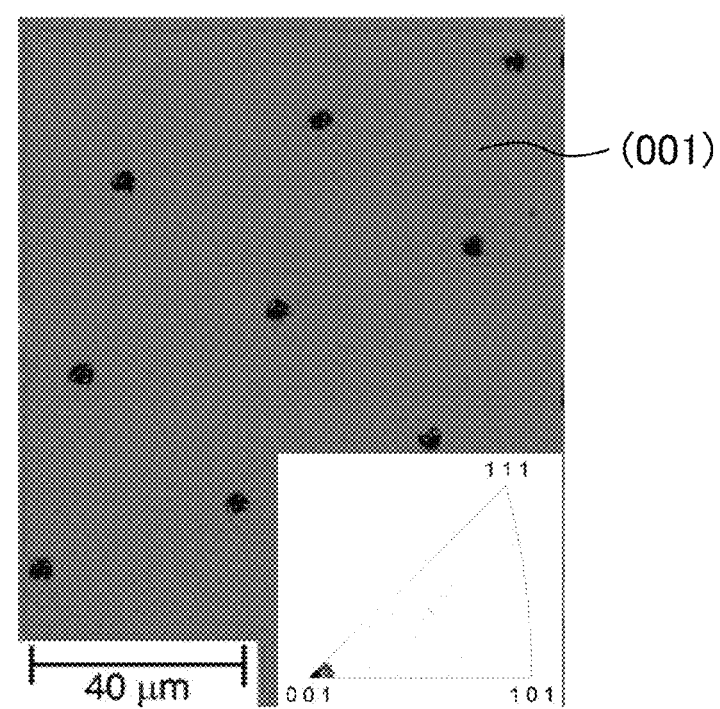
FIG. 12C shows an electron backscatter diffraction (EBSD) image of a transferred thin film.

FIG. 12A is an optical micrograph showing the surface of a yet-to-be-transferred thin film 2. FIG. 12B is a scanning electron microscope (SEM) photograph showing the surface of the transferred thin film 2. Here, an SOI substrate was used as the donor substrate, and openings 4 were formed and arranged in a hound's tooth check. As the receiver substrate, a glass substrate was used. As shown in FIG. 12B, the thin film 2 was transferred as it was onto the receiver substrate with the openings 4 maintained. FIG. 12C shows an electron backscatter diffraction (EBSD) image of the transferred thin film (monocrystalline silicon film). This image shows that the transferred monocrystalline silicon film had a highly uniform distribution of (100) crystal orientations.

Figure 13A:
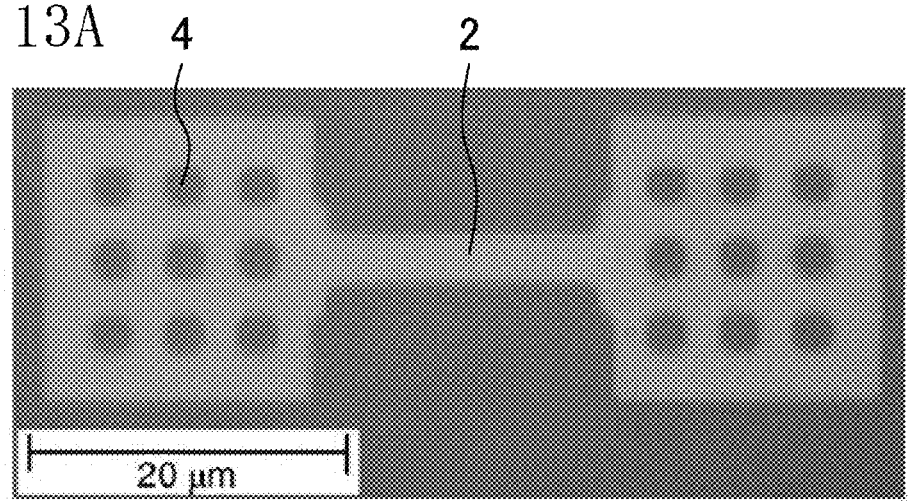
FIG. 13A is an optical micrograph showing a surface of a yet-to-be-transferred thin film pattern.
Figure 13B:
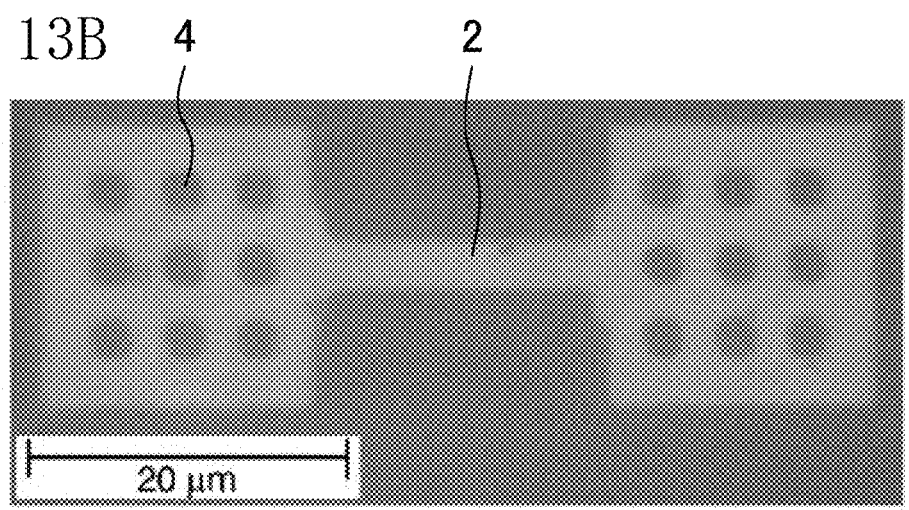
FIG. 13B is an optical micrograph showing the surface of the transferred thin film pattern.

FIG. 13A is an optical micrograph showing a yet-to-be-transferred thin film pattern that was shaped into a pattern for a thin film transistor to be described later. FIG. 13B is an optical micrograph of the transferred thin film pattern. Here, an SOI substrate was used as the donor substrate, and the openings 4 were formed through source/drain regions of the thin film transistor. As the receiver substrate, a flexible substrate was used. As shown in FIG. 13B, the thin film 2 transferred on the receiver substrate still maintained the same pattern having the openings 4.

Figure 14:
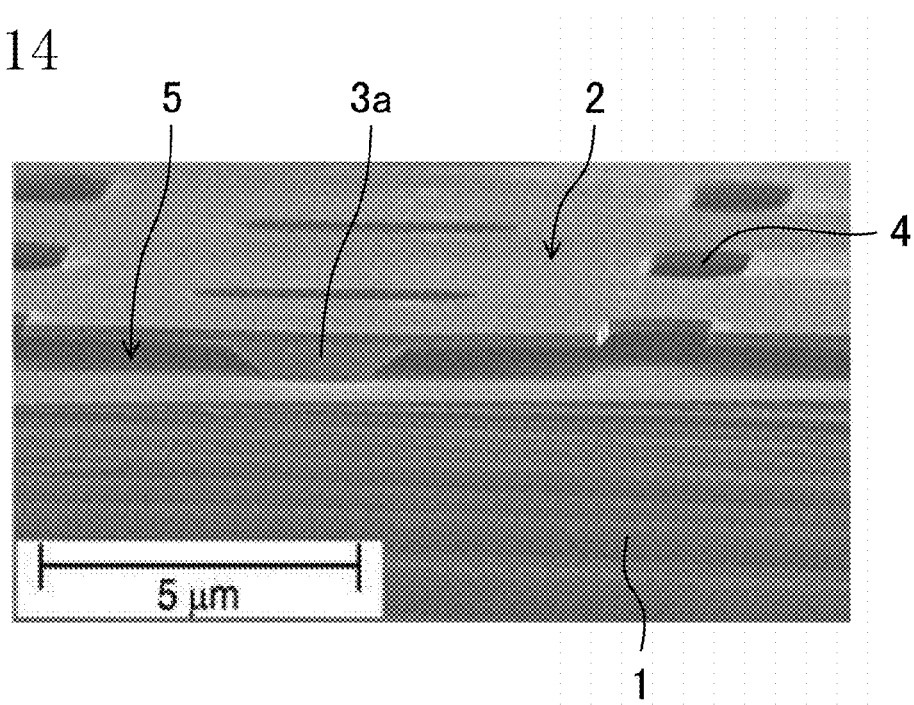
FIG. 14 is a sectional SEM photograph showing a cross section of a thin film having a suspended structure.

FIG. 14 is a sectional SEM photograph showing a state of a thin film 2 having a suspended structure. As shown in FIG. 14, the thin film 2 under which the hollow portion 5 has been formed is supported by the pillar 3a while maintaining its film shape.

In the present invention, the hollow portion 5 is formed by etching the sacrificial layer 3 through the openings 4 that have been cut through the thin film 2. Therefore, depending on the arrangement of the openings 4, the arrangement of the pillars 3a that are left after the etching of the sacrificial layer 3 changes.

Figure 15:
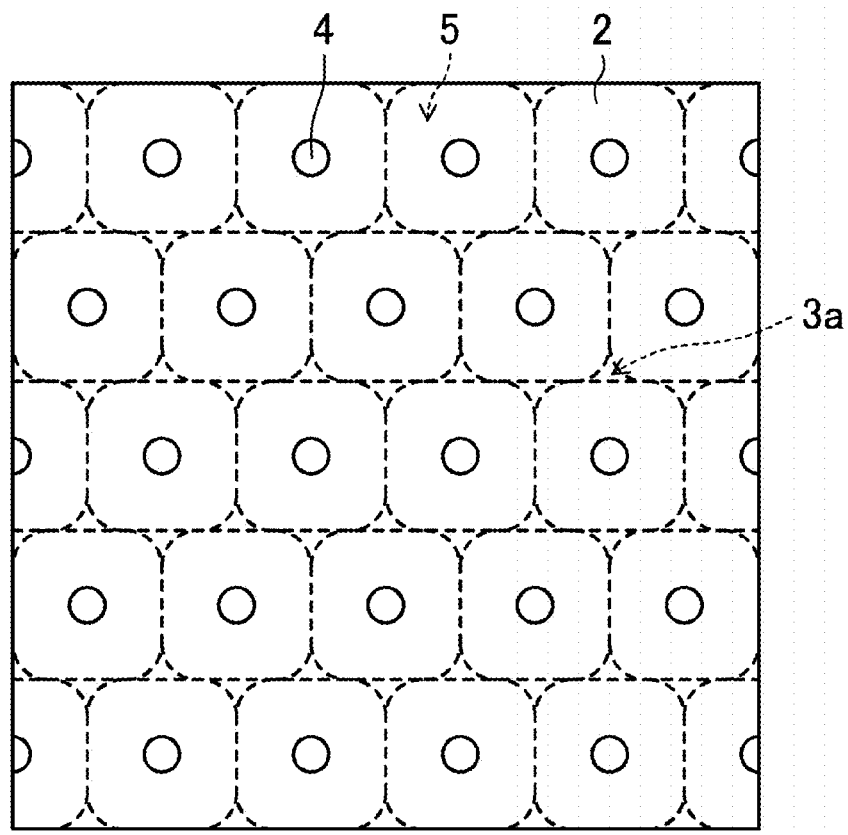
FIG. 15 is a plan view showing an example in which openings are arranged in a hound's tooth check.

FIG. 15 is a plan view showing an example in which the openings 4 are arranged in a hound's tooth check. In this case, as shown in FIG. 15, each opening 4 is surrounded with six pillars 3a. On the other hand, if the openings 4 are arranged in an array as shown in FIG. 4, each opening 4 is surrounded with four pillars 3a. Thus, arranging the openings 4 in a hound's tooth check results in a greater number of the pillars 3a to support the suspended thin film 2 than arranging the openings 4 in an array.

In this embodiment, the donor substrate is supposed to be an SOI substrate as an example. However, this is only an example of the present invention, and various other substrates may also be used. For example, the first substrate may be a quartz substrate or a glass substrate. The thin film 2 to be transferred may be a polysilicon film, an amorphous silicon film, or any other semiconductor thin film (for example, a germanium film, a silicon carbide (SiC) film, or an amorphous silicon hydride (a-Si:H) film). Alternatively, the thin film 2 to be transferred may also be an insulating film such as an oxide film or a film of any other type.

In this embodiment, the liquid interposed between the thin film and the second substrate is not limited to any particular liquid. Instead of water, ethanol, and acetone, perhydropolysilazane may be used, for example. With the use of perhydropolysilazane, not only the capillary adhesion force but also a chemical bonding force act on the thin film. Specifically, when perhydropolysilazane evaporates, a change (silica inversion) occurs in its molecular structure. This change causes chemical bonding between the interface of the thin film and the perhydropolysilazane. This chemical bonding force eventually contributes to the transfer of the thin film onto the second substrate.

Further, in this embodiment, the openings 4 formed through the thin film 2 are not limited to any particular shape. For example, each opening 4 may be rectangular or circular. The arrangement of the openings 4 is not limited to an array (inclusive of a matrix), but may include a random arrangement.

Furthermore, in this embodiment, the thin film 2 is supposed to be transferred as it is onto the second substrate 10. However, in order to further increase the adhesion between the thin film 2 and the second substrate 10, the step of conducting a heat treatment on the second substrate 10 onto which the thin film 2 has been transferred may be performed as an additional process step. For example, if the second substrate 10 that is the receiver substrate is a flexible substrate made of polyethylene terephthalate (PET) resin, a heat treatment at a temperature equal to or higher than the glass transition temperature (of about 110° C.) of the second substrate (PET substrate) 10 further increases the adhesion strength. It is preferable to perform the heat treatment at a temperature of lower than 150° C., because a heat treatment temperature of 150° C. or more will deteriorate the PET substrate. If the second substrate 10 that is the receiver substrate is a quartz substrate or a glass substrate, the heat treatment may be performed by laser irradiation. The heat treatment may be also performed by using a thermal plasma jet, a flash lamp, or an electric furnace, for example.

Second Embodiment

The donor substrate of the first embodiment described above includes a first substrate 1, of which the surface is covered with a thin film 2 with a sacrificial layer 3 sandwiched between the substrate 1 and the film 2. In the first embodiment, a hollow portion 5 is formed by etching the sacrificial layer 3 through the openings 4 formed through the thin film 2. That is to say, the height of the hollow portion 5 is determined by the thickness of the sacrificial layer 3.

It is also possible, however, to form the hollow portion 5 without the sacrificial layer 3. In a second embodiment of the present invention, it will be described how to transfer a thin film 2 onto a second substrate by using, as a donor substrate, a first substrate covered with the thin film 2.

FIGS. 16A to 16D and 17A and 17B show respective process steps of a thin film forming method according to the second embodiment of the present invention.

Figure 16A:
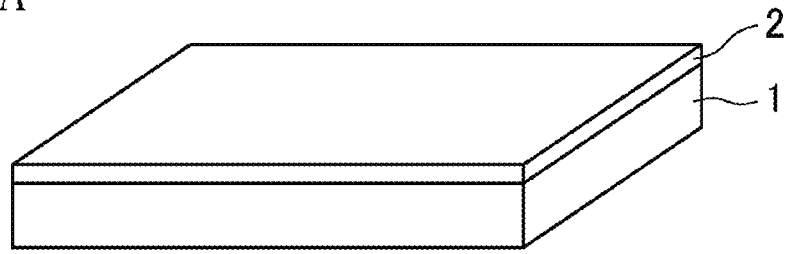
FIGS. 16A to 16D show respective process steps of a thin film forming method according to a second embodiment of the present invention.

First, as shown in FIG. 16A, a first substrate 1, of which the surface is covered with a thin film 2, is provided. As this substrate, a quartz substrate having an amorphous silicon film formed thereon may be used.

Figure 16B:
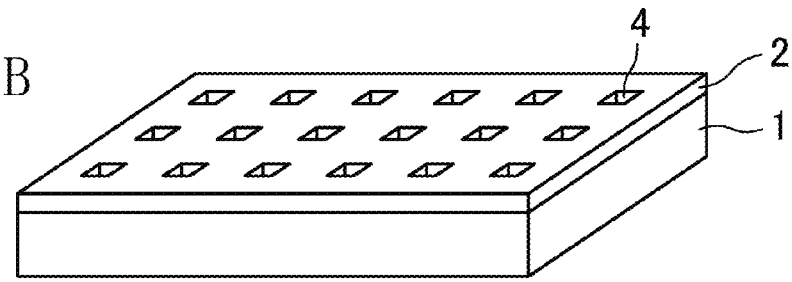

Next, as shown in FIG. 16B, a plurality of openings 4 are formed through the thin film 2. For example, the openings 4 may be formed by etching through a photolithographic process.

Figure 16C:
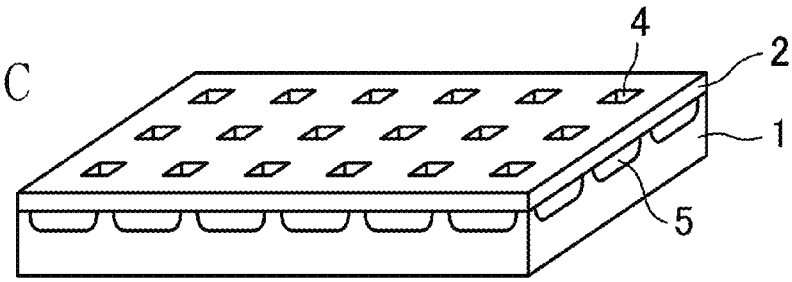

Next, as shown in FIG. 16C, the first substrate 1 is etched through the openings 4 to form a hollow portion 5 between the first substrate 1 and the thin film 2. For example, if the first substrate 1 is a quartz substrate, the first substrate 1 may be etched with hydrofluoric acid. At this time, the height of the hollow portion 5 becomes substantially equal to the lateral length of an etched portion of the first substrate 1.

Figure 16D:
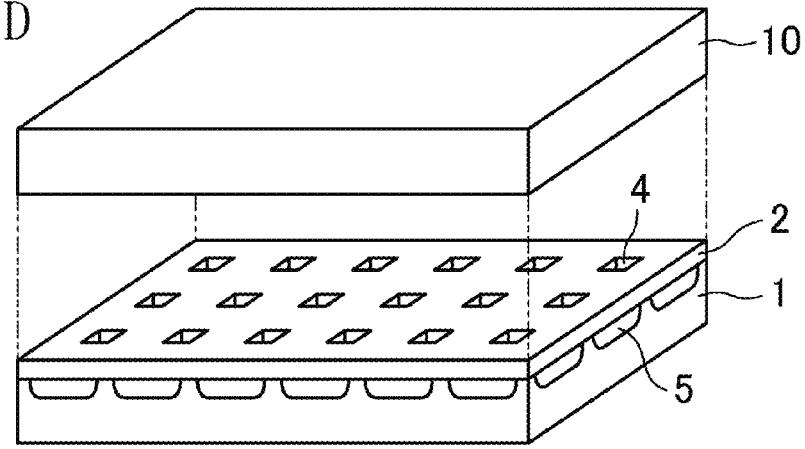

Thereafter, as shown in FIG. 16D, the thin film 2 is brought into contact with a second substrate 10 with a liquid (not shown) interposed between the thin film 2 and the second substrate 10. As the second substrate 10, a quartz substrate, a glass substrate, or a flexible substrate may be used, for example. As the liquid, water, ethanol, or acetone may be used, for example.

Figure 17A:
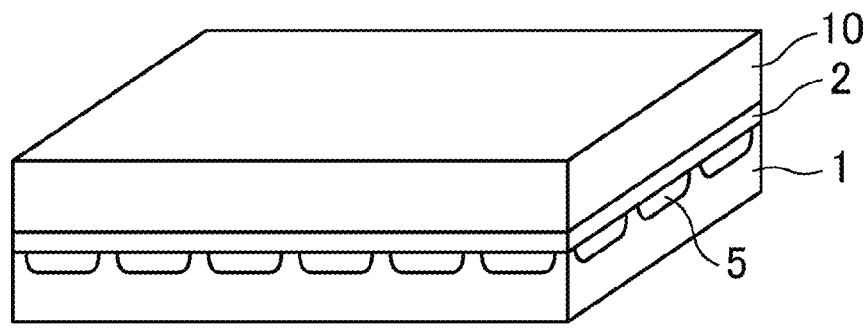
FIGS. 17A and 17B show respective process steps of the thin film forming method according to the second embodiment of the present invention.

Next, as shown in FIG. 17A, the first substrate 1 and/or the second substrate 10 are heated. This heating process is carried out at a temperature lower than the boiling point of the liquid. In this heating process, a halogen lamp or a hot plate may be used, for example. This heating process is performed to evaporate the liquid interposed between the thin film 2 and the second substrate 10. Therefore, not both of the first substrate 1 and the second substrate 10 have to be directly heated. For example, the heating process may be carried out in such a manner that one of these substrates is directly heated and the other is indirectly heated.

Figure 17B:
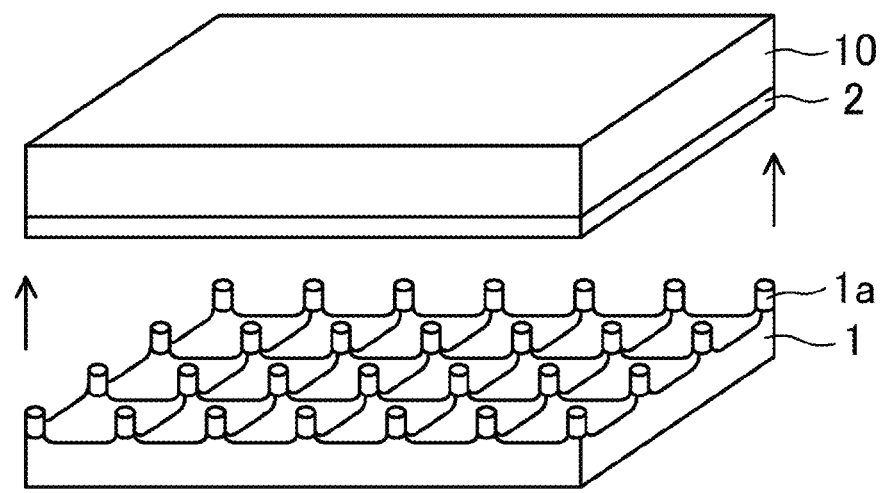

As shown in FIG. 17B, in this heating process step, the liquid interposed between the thin film 2 and the second substrate 10 evaporates off, which results in separation of the thin film 2 from the first substrate 1. Consequently, upon lifting the second substrate 10, the thin film 2 is transferred onto the second substrate 10. At this time, the thin film 2 is transferred as it is onto the second substrate 10 while maintaining its original pattern with the openings 4. On the first substrate 1, pillars 1a that constituted part of the first substrate 1 are left.

The transfer mechanism of this embodiment is basically the same as the transfer mechanism of the first embodiment. Specifically, thin film 2 is transferred onto the second substrate 10 by utilizing the difference between the capillary adhesion force that is exerted on the thin film 2 by the liquid interposed between the thin film 2 and the second substrate 10 and the bonding force between thin film 2 and the pillars 1a.

In this embodiment, the donor substrate is supposed to be a quartz substrate, of which the surface is covered with a thin film 2, as an example. However, this is only an example of the present invention, but various other substrates may be used as well. For example, the first substrate may be a silicon substrate or a glass substrate. The thin film 2 to be transferred may be a polysilicon film or any other semiconductor thin film (for example, a germanium film, a silicon carbide (SiC) film, or an amorphous silicon hydride (a-Si:H) film). Alternatively, the thin film 2 to be transferred may also be an insulating film such as an oxide film or a film of any other type.

In this embodiment, the liquid interposed between the thin film and the second substrate is not limited to any particular liquid. Instead of water, ethanol, and acetone, perhydropolysilazane may be used, for example. With the use of perhydropolysilazane, not only the capillary adhesion force but also a chemical bonding force act on the thin film. Specifically, when perhydropolysilazane evaporates, a change (silica inversion) occurs in its molecular structure. This change causes chemical bonding between the interface of the thin film and the perhydropolysilazane. This chemical bonding force eventually contributes to the transfer of the thin film onto the second substrate.

Further, in this embodiment, the openings 4 formed through the thin film 2 are not limited to any particular shape. For example, each opening 4 may be rectangular or circular. The arrangement of the openings 4 is not limited to an array (inclusive of a matrix), but may include a random arrangement.

Furthermore, in this embodiment, the thin film 2 is supposed to be transferred as it is onto the second substrate 10. However, in order to further increase the adhesion between the thin film 2 and the second substrate 10, the step of conducting a heat treatment on the second substrate 10 onto which the thin film 2 has been transferred may be performed as an additional process step.

Application Examples

The present invention allows for transferring a thin film formed on a donor substrate (a first substrate) onto a receiver substrate (a second substrate) with its film quality maintained. In addition, according to the present invention, the donor substrate and the receiver substrate may be selected arbitrarily. Therefore, by transferring a monocrystalline silicon film formed on an SOI substrate onto a glass substrate or a flexible substrate, a monocrystalline silicon film with perfectly controlled crystal plane orientations may be formed on the glass substrate or the flexible substrate, which has been considered difficult in the known art.

Methods for making electronic devices by the thin film transfer technique of the present invention will be described below.

(1) Making Thin Film Transistor

FIGS. 18A to 18E and 19A to 19D show respective process steps of a method for making a thin film transistor (a field-effect transistor) by the thin film transfer technique of the present invention.

Figure 18A:
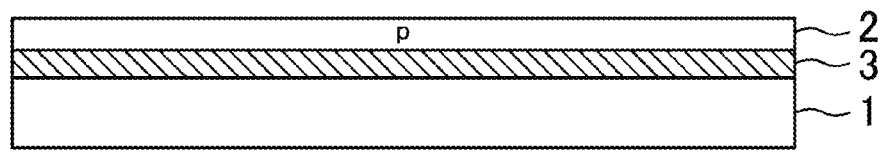
FIGS. 18A to 18E show respective process steps of a method for making a thin film transistor by the thin film transfer technique of the present invention.

First, as shown in FIG. 18A, an SOI substrate is provided. The SOI substrate includes a silicon substrate 1 which has a p-type monocrystalline silicon film (hereinafter referred to simply as a "silicon film") 2 that covers the substrate 1 with a silicon dioxide film 3 sandwiched between the silicon substrate 1 and the silicon film 2.

Figure 18B:
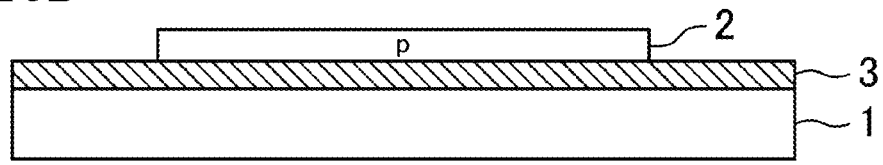

Next, as shown in FIG. 18B, the p-type silicon film 2 is patterned into regions to serve as source/drain regions and a channel region of the transistor.

Figure 18C:
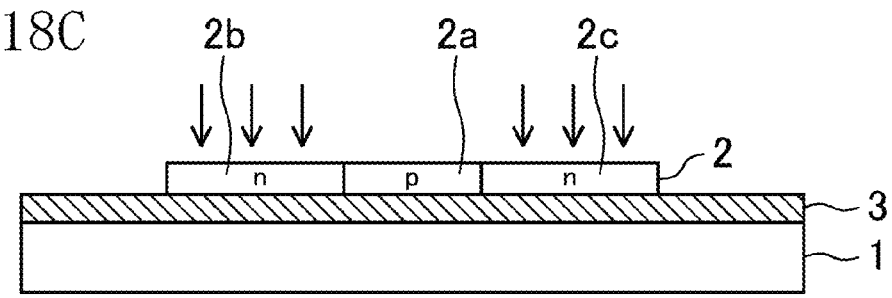

Next, as shown in FIG. 18C, the source/drain regions 2b and 2c are doped with an n-type dopant (e.g., phosphorus) by ion implantation. A heat treatment is then conducted (at a temperature of about 600-1000° C.) to activate the dopant.

Figure 18D:
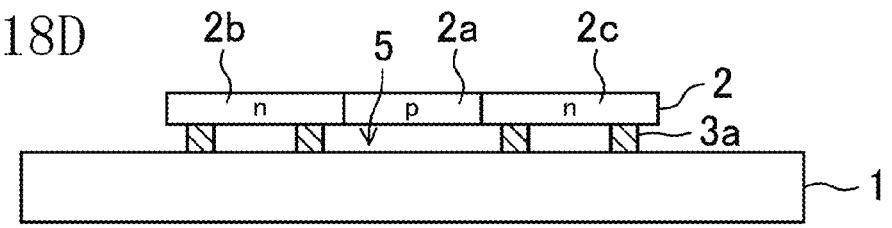

Next, as shown in FIG. 18D, openings (not shown) are formed through the silicon film 2, and then, the silicon dioxide film 3 is isotropically etched with hydrofluoric acid through the openings, thereby forming a hollow portion 5 between the silicon substrate 1 and the silicon film 2. As a result, the silicon film 2 comes to have a suspended structure supported by pillars 3a left as a consequence of the etching of the silicon dioxide film 3.

Figure 20A:
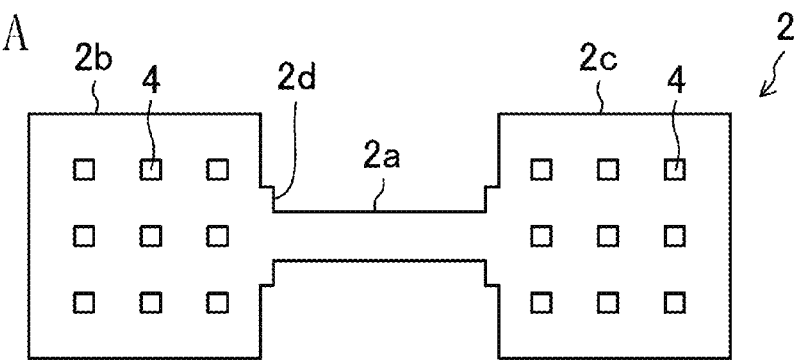
FIG. 20A is a plan view showing a configuration of a patterned monocrystalline silicon film.
Figure 20B:
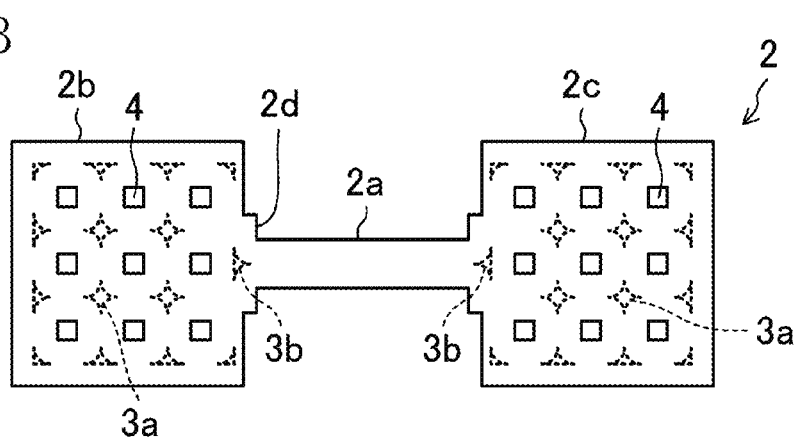
FIG. 20B is a plan view showing the monocrystalline silicon film that has a suspended structure.

FIG. 20A is a plan view showing the configuration of the patterned silicon film 2. FIG. 20B is a plan view showing the silicon film 2 which now has a suspended structure.

As shown in FIG. 20A, the openings 4 are present only in the regions to be source/drain regions 2b and 2c, and absent from the region to be a channel region 2a. The openings 4 are arranged in a matrix (3×3). Connecting portions 2d have been formed at the boundaries between the channel region 2a and the source/drain regions 2b and 2c.

When the silicon dioxide film 3 is etched through the openings 4 thus arranged, the silicon film 2 comes to have a suspended structure supported by a plurality of pillars 3a, as shown in FIG. 20B. Here, the pillars 3a are present only in the source/drain regions 2b and 2c, whereas the channel region 2a is suspended without any support. However, the pillars 3a that are arranged in the entire source/drain regions 2b and 2c and pillars 3b that are also present in the connecting portions 2d stably support the suspended channel region 2a.

Figure 21:
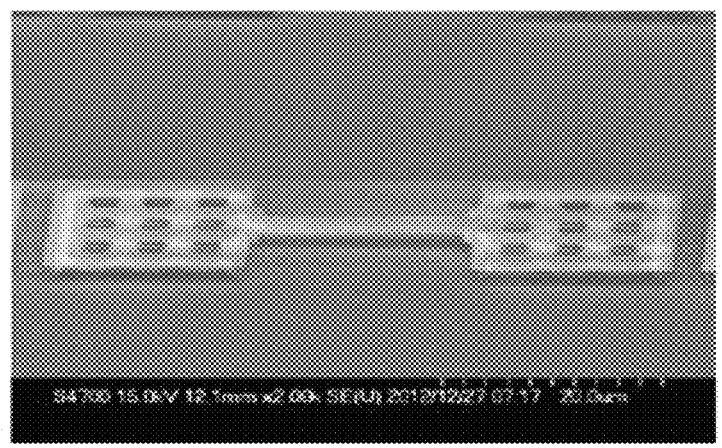
FIG. 21 is an SEM photograph of a monocrystalline silicon film that has a suspended structure.

FIG. 21 is an SEM photograph of the silicon film 2 with the suspended structure that has been formed in the above manner. As can be seen from FIG. 21, the silicon film with such a suspended structure still maintains its film shape.

Figure 18E:
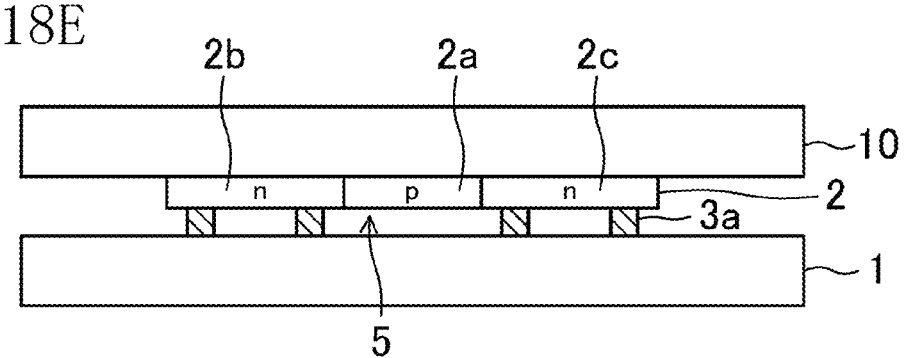

Next, as shown in FIG. 18E, the silicon film 2 is brought into contact with a flexible substrate 10 with water (not shown) interposed between the silicon film 2 and the flexible substrate 10.

Figure 19A:
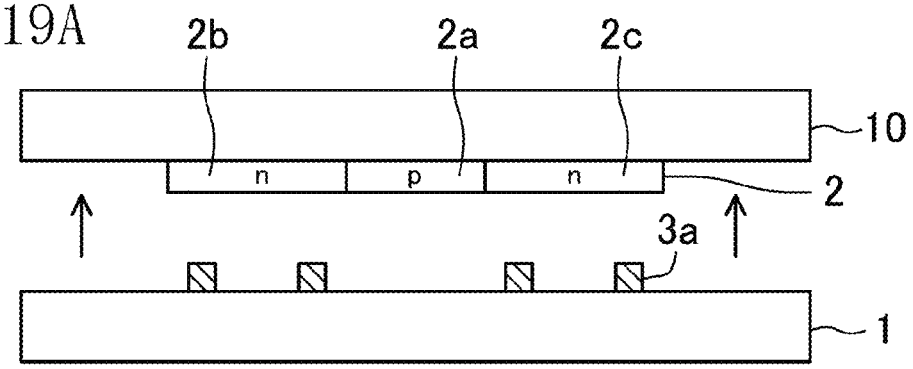
FIGS. 19A to 19D show steps of the method for making a thin film transistor by the thin film transfer technique of the present invention.

Next, as shown in FIG. 19A, the silicon substrate 1 and/or the flexible substrate 10 are/is heated. As a result of this heating, the water interposed between the silicon film 2 and the flexible substrate 10 evaporates off, which results in that the silicon film 2 is separated from the silicon substrate 1 and transferred onto the flexible substrate 10. Thereafter, a heat treatment is conducted on the flexible substrate 10 having the silicon film 2 transferred thereon. For example, if the flexible substrate 10 is a PET substrate, the heat treatment may be performed at a temperature of about 120° C. This heat treatment further increases the strength of bonding between the silicon film 2 and the flexible substrate 10.

Figure 19B:
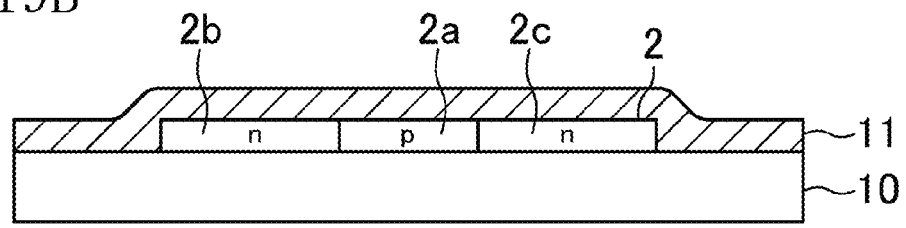

Next, as shown in FIG. 19B, a gate insulating film 11 is formed on the transferred silicon film 2. The gate insulating film 11 may be formed by applying a polysilazane solution.

Figure 19C:
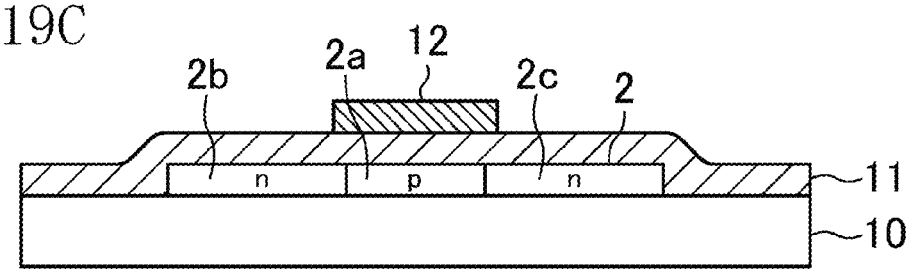

Next, as shown in FIG. 19C, a gate electrode 12 is formed on the gate insulating film 11. The gate electrode 12 may be formed by, for example, vapor deposition of aluminum, sputtering, or an inkjet process using metal nanoparticles.

Figure 19D:
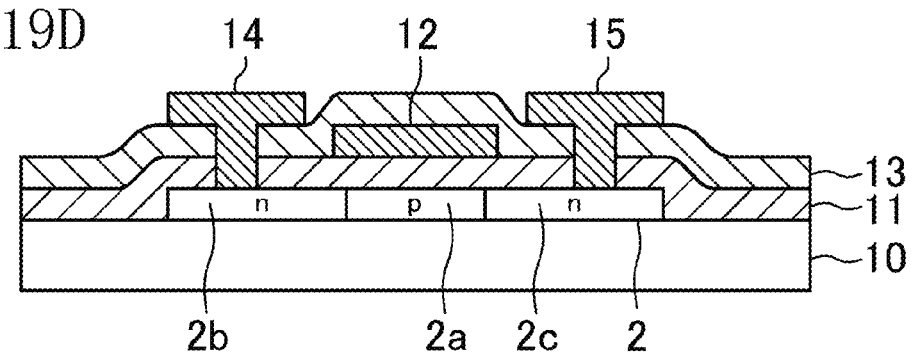

Finally, as shown in FIG. 19D, after an interlevel dielectric film 13 has been deposited over the gate electrode 12, holes are cut through the interlevel dielectric film 13 and the gate insulating film 11. Thereafter, source/drain electrodes 14 and 15 are formed to fill these holes. In this manner, a thin film transistor including a monocrystalline silicon film is fabricated. Here, the interlevel dielectric film 13 may be formed by applying an appropriate material, for example. The source/drain electrodes may be formed by, for example, sputtering of aluminum, vapor deposition, or an inkjet process using metal nanoparticles.

As can be seen from the foregoing, the thin film transfer technique of the present invention allows for making a thin film transistor of a monocrystalline silicon film on the flexible substrate 10. Further, with the use of this transfer technique, activation of source/drain regions which requires a high-temperature process may be performed on the SOI substrate that is the donor substrate, and the flexible substrate 10 of which the heat resistance is low may be subjected to a low-temperature process to form a gate insulating film, electrodes, and other components. Thus, the technique of the present invention allows for manufacturing high-performance thin film transistors while minimizing the variation in characteristic.

Meanwhile, the interface state between the silicon film 2 and the gate insulating film 11 in the channel region 2a has influence on the characteristics of the thin film transistor. Improvement of the film quality of the gate insulating film 11 is effective at improving this interface state. Unfortunately, no processes for improving the film quality of the gate insulating film 11 through a heat treatment at a high temperature are applicable to the gate insulating film 11 that lies on the flexible substrate 10 of which the heat resistance is low.

In view of the forgoing, the following process is suggested as a method for improving the interface state between the silicon film 2 and the gate insulating film 11 in the channel region 2a. Specifically, the surface of the silicon film 2 may be subjected to thermal oxidation before being transferred onto the flexible substrate 10 such that a thermal oxide film is formed on the surface of the silicon film 2. With the use of this process, a thermal oxide film having good film quality is interposed between the silicon film 2 and the gate insulating film 11 in the channel region 2a, which results in improvement of the interface state between the silicon film 2 and the gate insulating film 11 in the channel region 2a.

FIGS. 22A to 22D show respective process steps of a process for improving the interface state between the silicon film 2 and the gate insulating film 11 in the channel region 2a, which is applicable to the method for making the thin film transistor shown in FIGS. 18A to 18E and 19A to 19D. The process steps shown in FIGS. 22B, 22C, and 22D correspond to the ones shown in FIGS. 18E, 19A, and 19B, respectively.

Figure 22A:
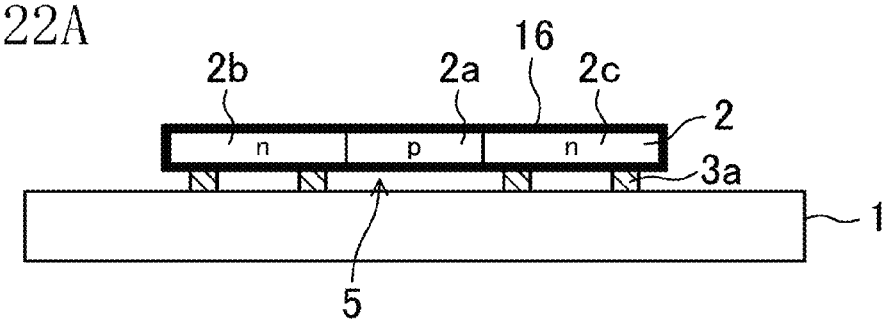
FIGS. 22A to 22D show respective process steps of another method for making a thin film transistor according to the present invention.

In the process step shown in FIG. 22A, the silicon oxide film 3 is isotropically etched through the openings 4 formed through the silicon film 2 so as to form a hollow portion 5 between the silicon substrate 1 and the silicon film 2 as in FIG. 18D. Thereafter, the surfaces of the silicon film 2 that is supported by the pillars 3a that constituted part of the silicon dioxide film 3 are subjected to thermal oxidation, thereby forming a thermal oxide film 16 on the surfaces of the silicon film 2. The thermal oxidation is suitably performed in an oxygen atmosphere at a temperature of 800° C. to 1100° C. so as to form, on the surfaces of the silicon film 2, a thermal oxide film 16 to a thickness of about 2-15 nm. At this time, since a sufficient amount of oxygen is supplied to the hollow portion 5 through the openings 4 of the silicon film 2, the surface of the silicon film 2 (the lower surface in FIG. 22A) that faces the hollow portion 5 is also covered with the thermal oxide film 16. That portion of the film 16 on this surface facing the hollow portion 5 is almost as thick as the portion on the opposite exposed surface of the silicon film 2 (the upper surface in FIG. 22A). Since oxygen diffuses also to the points of contact between the source/drain regions 2b and 2c and the pillars 3a along their interfaces, the thermal oxide film 16 is formed to a substantially uniform thickness over the entire surfaces of the silicon film 2. Further, this process step of thermal oxidation also activates the dopant ions that have been implanted into the source/drain regions 2b and 2c.

Figure 22B:
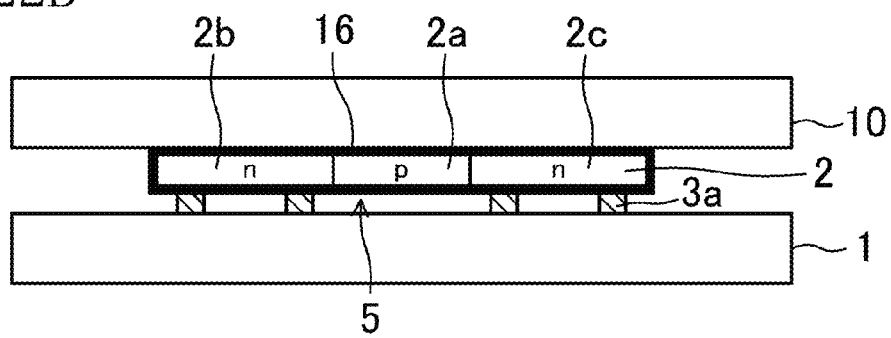

Next, as shown in FIG. 22B, the silicon film 2 is brought into contact with the flexible substrate 10 with water (not shown) interposed between the silicon film 2 and the flexible substrate 10.

Figure 22C:
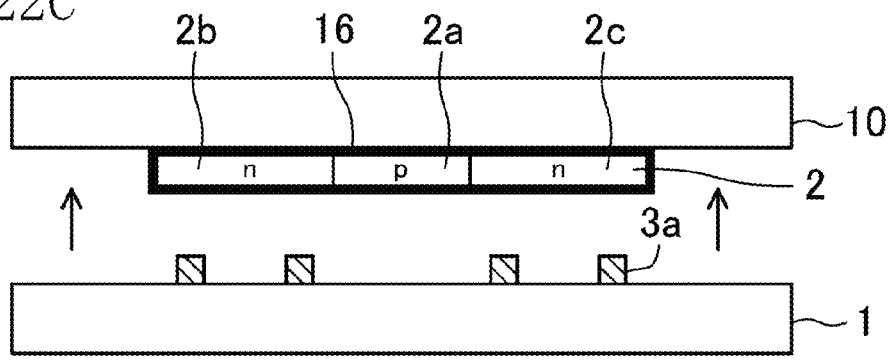

Thereafter, as shown in FIG. 22C, the silicon substrate 1 and/or the flexible substrate 10 are/is heated. As a result of this heating, the water interposed between the silicon film 2 and the flexible substrate 10 evaporates off, which results in that the silicon film 2 is separated from the silicon substrate 1 and transferred onto the flexible substrate 10.

Figure 22D:
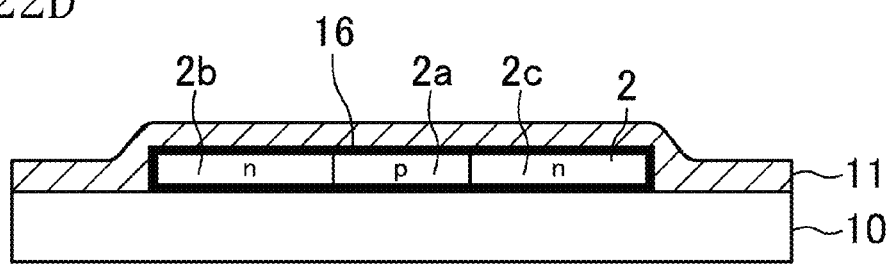

Next, as shown in FIG. 22D, a gate insulating film 11 is formed over the transferred silicon film 2. At this time, the thermal oxide film 16 that is interposed between that portion of the silicon film 2 in the channel region 2a and the gate insulating film 11 improves the interface state between that portion of the silicon film 2 in the channel region 2a and the gate insulating film 11.

Finally, in accordance with the process steps shown in FIGS. 19C and 19D, a gate electrode 12 and source/drain electrodes 14 and 15 are formed, thereby completing a thin film transistor.

In the process step described above, a gate insulating film 11 is further formed on the thermal oxide film 16. If the thermal oxide film 16 is thick enough to achieve the predetermined characteristic for a thin film transistor, however, the thermal oxide film 16 may be used as it is as a gate insulating film, without forming the gate insulating film 11.

The rate of thermal oxidation of the silicon film 2 is dependent on the concentrations of the dopants in the silicon film 2. Therefore, the conditions of the thermal oxidation may be suitably set with the dopant concentrations (in particular, the dopant concentration in the source/drain regions 2b and 2c) taken into consideration. Alternatively, the dopant concentration may be appropriately adjusted such that the thermal oxide film 16 has a predetermined thickness.

Figure 23A:
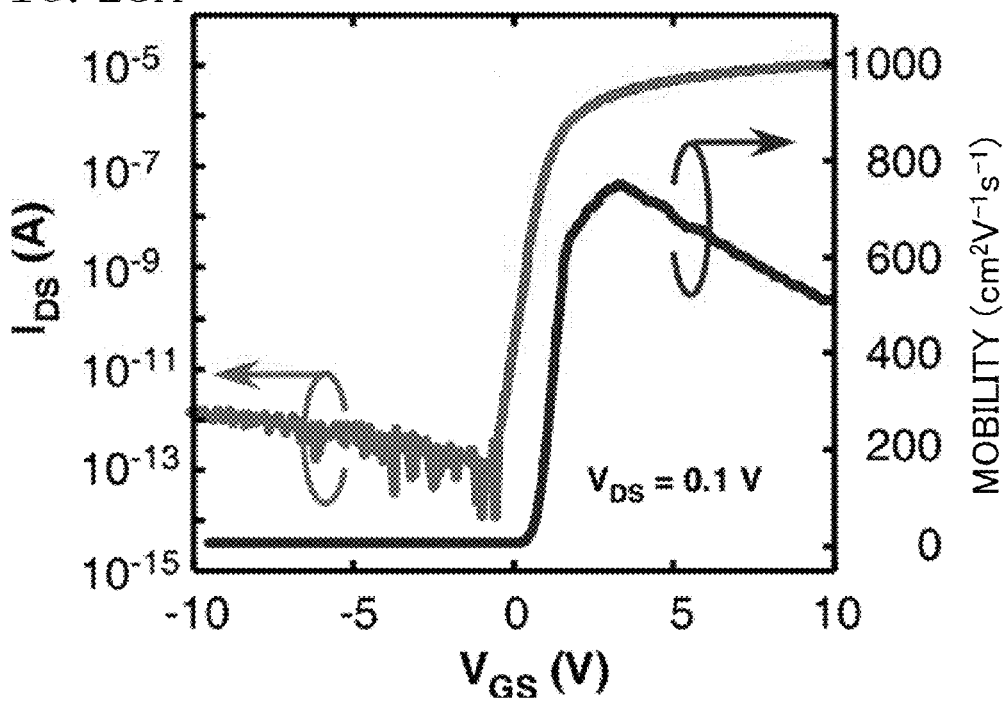
FIGS. 23A and 23B are graphs respectively showing the $I_{DS}$-$V_{GS}$ characteristics and $I_{DS}$-$V_{DS}$ characteristics of a thin film transistor formed on a glass substrate.
Figure 23B:
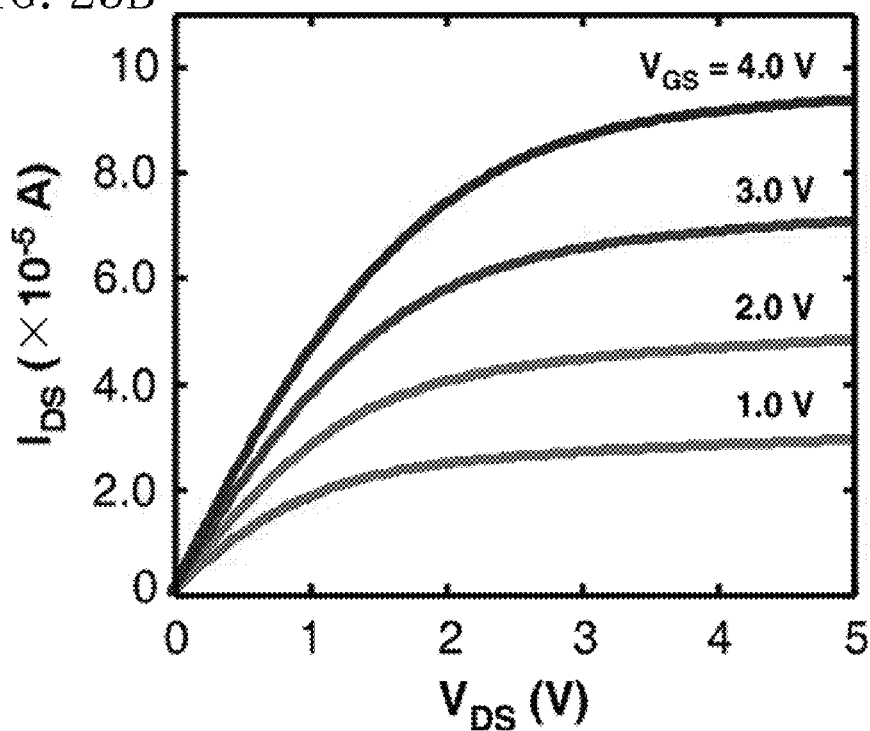

FIGS. 23A and 23B are graphs showing the results of evaluation of the characteristics of a thin film transistor fabricated in this manner. Here, FIG. 23A shows how the drain current ($I_{DS}$) varies with the gate-source voltage ($V_{GS}$) ($I_{DS}$-$V_{GS}$ characteristics) and how the field effect mobility varies with the gate-source voltage ($V_{GS}$). FIG. 23B shows how the drain current ($I_{DS}$) varies with the drain-source voltage ($V_{DS}$) ($I_{DS}$-$V_{DS}$ characteristics). The thin film transistor under test was an n-channel field-effect transistor that had a channel length of 4 μm (an effective channel length of 3.7 μm) and a channel width of 3 μm. In the transistor, the thermal oxide film 16 had a thickness of 10 nm and the gate insulating film 11 had a thickness of 206 nm. As the receiver substrate 10, a glass substrate was used.

As shown in FIG. 23A, the field effect mobility had a maximum of 742 $cm^2V^{-1}s^{-1}$, and a threshold of 1.5 V. The sub-threshold leakage current was about $1\times10^{-13}$ A, and the on/off ratio of the drain current ($I_{DS}$) was about eight digits. These numerical values nearly correspond to the characteristics of an n-channel field-effect transistor formed on a bulk monocrystalline silicon substrate, and thus, indicate that the transistor under test exhibited high performance as a thin film transistor.

As shown in FIG. 23B, no parasitic resistance or no kinks are seen in the $I_{DS}$-$V_{DS}$ characteristics, which indicates that the transistor had good saturation characteristics.

This high performance as a thin film transistor proves that the silicon film 2 transferred onto the glass substrate 10 was a monocrystalline film, and the interface state between that portion of the silicon film 2 in the channel region 2a and the gate insulating film 11 was good.

That is to say, in the method for making a thin film transistor shown in FIGS. 18A to 18E and 19A to 19D, by forming a thermal oxide film 16 on the surfaces of the silicon film 2 by thermal oxidation prior to the transfer of the silicon film 2 onto the glass substrate 10, a high-performance thin film transistor is provided.

Optionally, after the silicon film 2 has been transferred onto the glass substrate 10 as shown in FIG. 22C, the glass substrate 10 on which the silicon film 2 has been transferred may be subjected to a heat treatment to increase the degree of closeness of contact between the silicon film 2 and the glass substrate 10. At this time, the impurities contained in the glass substrate 10 (for example, an alkali metal present on the surfaces of, or inside, the substrate) are activated by the heat treatment and may diffuse and enter the silicon film 2. In particular, if the impurities diffusing reached the channel region 2a, those impurities may produce mobile ions and trap levels, and may cause leakage current, decrease in the mobility and reliability.

As shown in FIG. 22C, however, the thermal oxide film 16, which is interposed between the glass substrate 10 and the silicon film 2, serves as a barrier that prevents the impurities that have diffused from the glass substrate 10 from entering the silicon film 2. Therefore, even if an impurity which may become a contamination source is present in the glass substrate 10 that is the receiver substrate, the thermal oxide film 16 between the glass substrate 10 and the silicon film 2 allows for preventing the degradation in the characteristics of the thin film transistor, which may be caused by the diffusion of the impurity.

Figure 24:
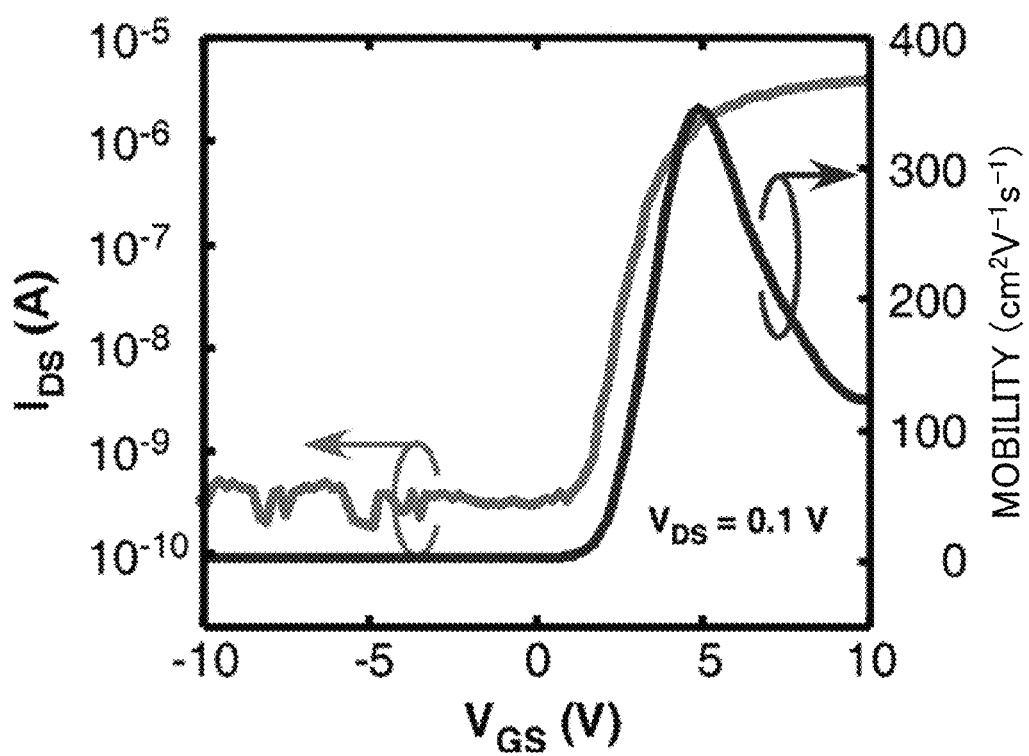
FIG. 24 is a graph showing the $I_{DS}$-$V_{GS}$ characteristics of a thin film transistor formed by transfer onto a flexible substrate.

FIG. 24 is a graph showing the results of evaluation of the $I_{DS}$-$V_{GS}$ characteristics of a thin film transistor which was produced under the same or similar conditions as/to the forgoing conditions by using a PET substrate (a flexible substrate) as the receiver substrate 10 instead of the glass substrate.

As shown in FIG. 24, the field effect mobility had a maximum of 343 $cm^2V^{-1}s^{-1}$, and a threshold of 3.9 V. The sub-threshold leakage current was about $6\times10^{-10}$ A, and the on/off ratio of the drain current ($I_{DS}$) was about four digits. Even though these numerical values are not comparable to the characteristics of a thin film transistor fabricated by transferring a silicon film 2 onto a glass substrate, these numerical values show that the performance of this transistor is significantly higher than that of a thin film transistor of a polysilicon film. The reason why this thin film transistor had declined performance compared to the case where a glass substrate was used as the receiver substrate 10 would be that: in this transistor, the gate insulating film 11, deposited on the transferred silicon film 2 at a lower temperature than in the case where the glass substrate was used, had inferior film quality to the gate insulating film deposited on the glass substrate.

Figure 25:
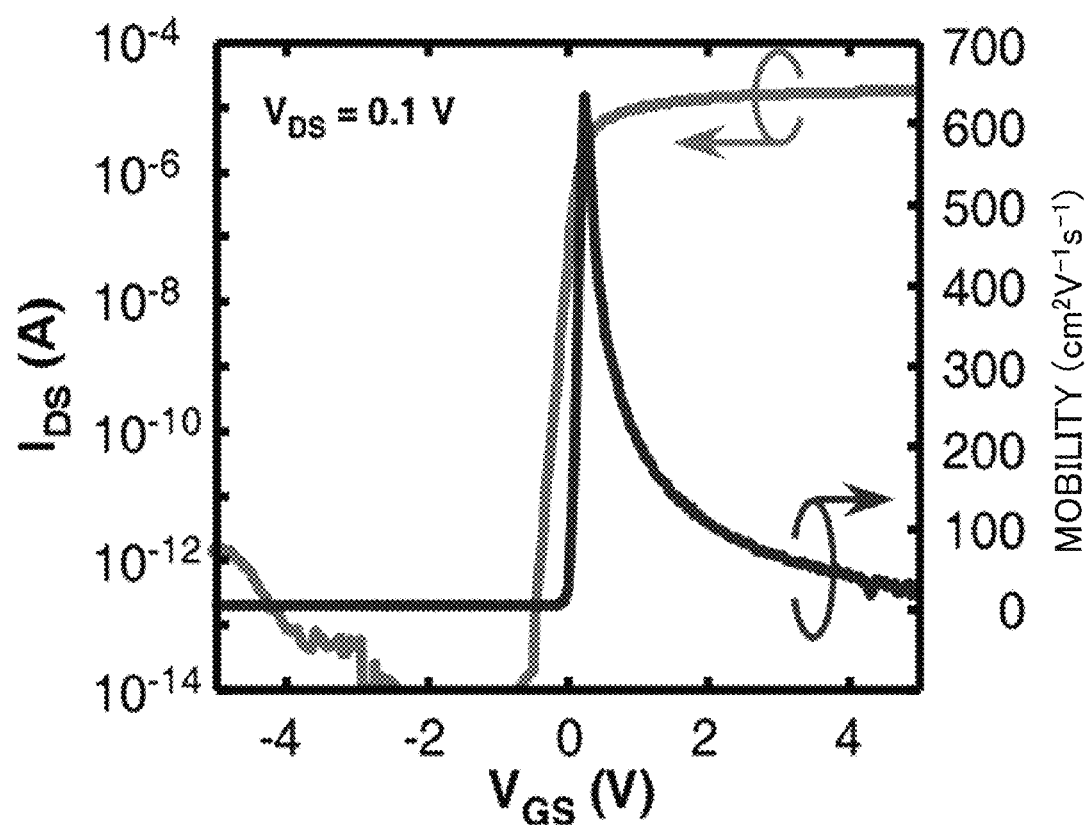
FIG. 25 is a graph showing the $I_{DS}$-$V_{GS}$ characteristics of a thin film transistor which has been formed by transfer onto a flexible substrate (and of which the insulating film is comprised only of a thermal oxide film).

FIG. 25 is a graph showing the results of evaluation of the $I_{DS}$-$V_{GS}$ characteristics of a thin film transistor which was fabricated by using a PET substrate (a flexible substrate) as the receiver substrate 10, instead of the glass substrate. This thin film transistor included no additional gate insulating film 11 on its thermal oxide film 16, and therefore, its thermal oxide film 16 with a thickness of 10 nm was used as it was as a gate insulating film. The other manufacturing conditions were the same as those of the thin film transistor of FIG. 24.

As shown in FIG. 25, the field effect mobility had a maximum of 627 $cm^2V^{-1}s^{-1}$, and a threshold of 0.07 V. The sub-threshold leakage current was about $1.3\times10^{-12}$ A, and the on/off ratio of the drain current ($I_{DS}$) was about seven digits. As can be understood from these numerical values, the thin film transistor in which the gate insulating film is comprised only of the thermal oxide film 16 had significantly improved characteristics as compared to the one in which a gate insulating film 11 was formed on its thermal oxide film 16. The reason for this would be as follows: The gate insulating film 11 was an oxide film formed on the thermal oxide film 16 by a low-temperature process (e.g., deposition by plasma CVD or application of a polysilazane solution), and therefore, would have had inferior film quality to a thermal oxide film, and would have allowed a larger amount of leakage current to flow through it. On the other hand, the thermal oxide film 16 that also functioned as the gate insulating film 11 by itself would have reduced the leakage current.

Meanwhile, according to the present invention, the yet-to-be-transferred silicon film 2 has a suspended structure supported by the pillars 3a. In particular, as shown in FIG. 22A, the channel region 2a is suspended without any support. If a thermal oxide film 16 is formed on a surface of the silicon film 2 having such a suspended structure, a volume expansion occurs when the surface of the silicon film 2 turns into the thermal oxide film 16 by thermal oxidation. Therefore, the thermal oxide film 16 thus formed applies stress to the silicon film 2, which may result in warping the silicon film 2 that has the suspended structure.

Figure 26A:
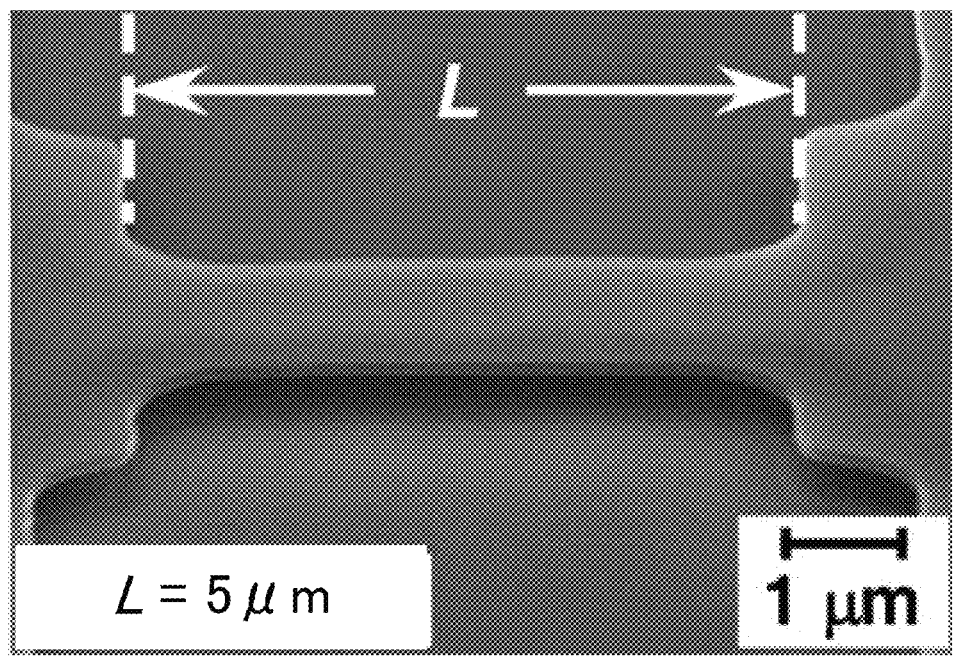
FIGS. 26A and 26B are SEM photographs each showing a state of the vicinity of a channel region of a silicon film which has a suspended structure and on a surface of which a thermal oxide film has been formed.
Figure 26B:
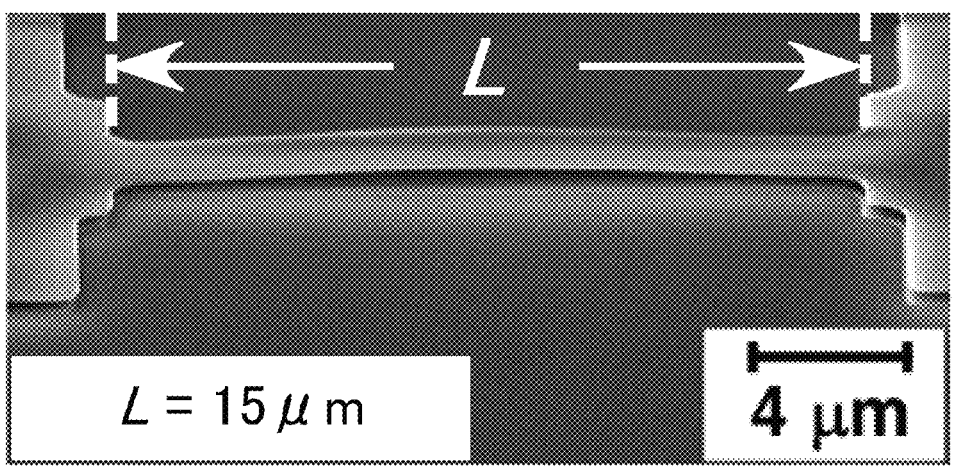

FIGS. 26A and 26B are SEM photographs each showing a state of the silicon film 2 with a suspended structure in the vicinity of the channel region 2a in a situation where a thermal oxide film 16 was formed to a thickness of 10 nm on its surface. FIG. 26A shows a case where the channel length (L) was 5 μm, and FIG. 26B shows a case where the channel length (L) was 15 μm.

As shown in FIG. 26A, when the channel length (L) was as short as 5 μm, the channel region 2a was not warped. On the other hand, when the channel length (L) was as long as 15 μm, the channel region 2a was warped.

Figure 27A:
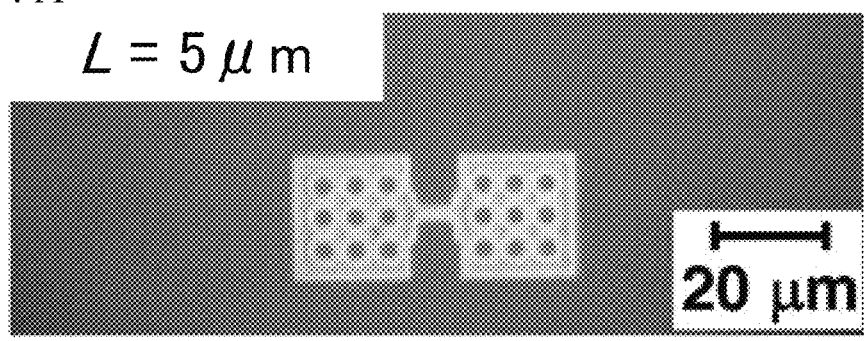
FIGS. 27A and 27B are optical micrographs respectively showing a state of a silicon film with a suspended structure that have been transferred onto glass substrates.
Figure 27B:
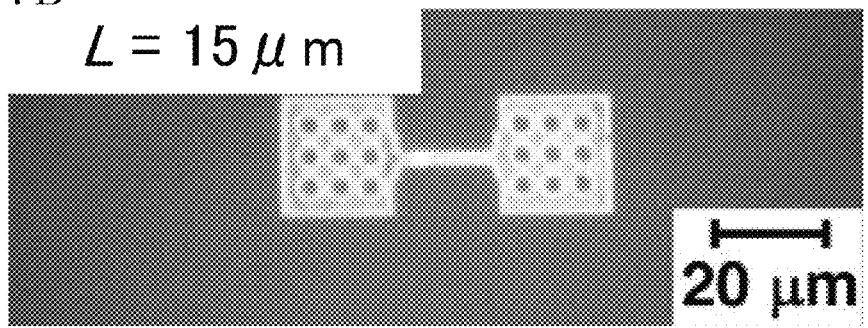

FIGS. 27A and 27B are optical micrographs respectively showing how the silicon films 2 with the suspended structure as shown in FIGS. 26A and 26B changed after having been transferred onto the glass substrates 10. As shown in FIG. 27A, the channel region 2a, of which the channel length (L) was as short as 5 μm, was transferred to come into close contact with the glass substrate 10. On the other hand, as shown in FIG. 27B, some interference colors were observed in the channel region 2a, of which the channel length (L) was as long as 15 μm. Thus, part of this channel region 2a was transferred to go out of contact with the glass substrate 10.

In view of this problem, the present inventors carried out experiments to see how the silicon film 2 having a suspended structure warped when the thermal oxide film 16 was formed on the surface of the silicon film 2. For that purpose, three types of silicon films 2 having a suspended structure and three different channel lengths were formed, and thermal oxide films 16 having different thicknesses were formed on the silicon films 2. The degree of warp of each silicon film 2 in the channel region 2a was measured. The degree of warp of each silicon film 2 was determined by calculating the magnitude of displacement from the original position of a center portion of the channel region 2a. The magnitude of displacement was observed on an SEM photograph of each silicon film 2 taken at an angle of 70°. Here, the original position was set with reference to a point located at the height (300 nm) of the hollow portion 5 between the silicon substrate 1 and the silicon film 2 and was supposed to be located between the surface of the silicon substrate 1 and that point.

Figure 28:
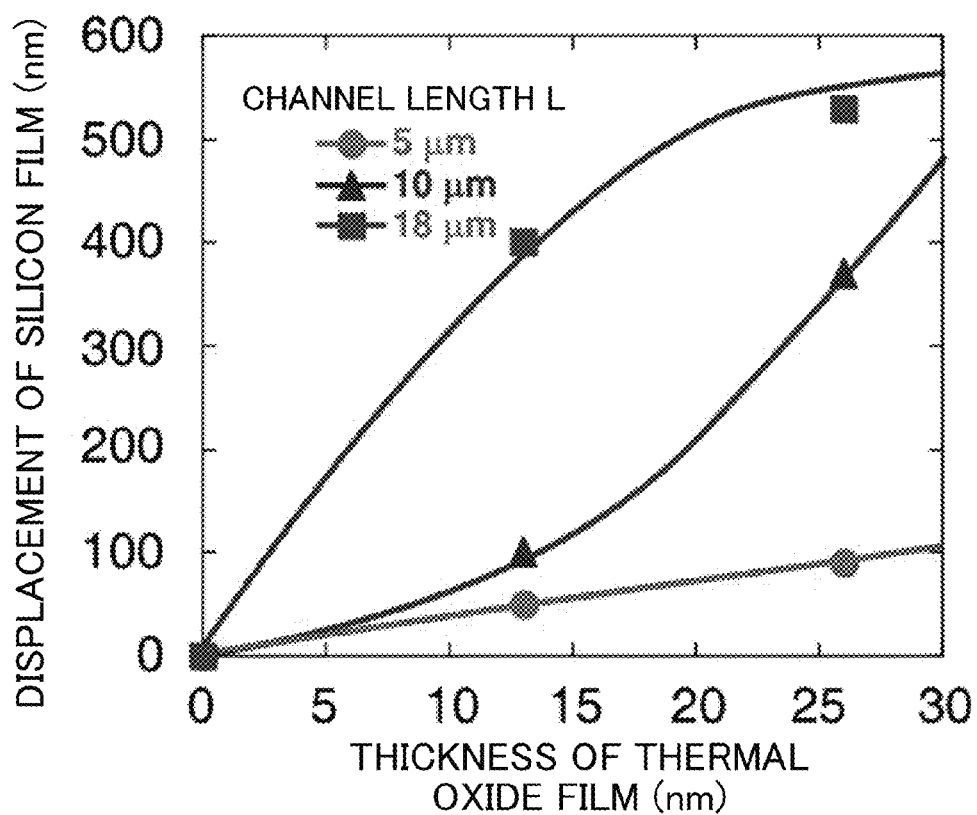
FIG. 28 is a graph showing displacement of a silicon film with respect to the thickness of a thermal oxide film.

FIG. 28 is a graph showing the results of the measurement. As shown in FIG. 28, as the thickness of the thermal oxide film 16 increases, the magnitude of displacement of the silicon film 2 increases. If the thickness of the thermal oxide film 16 is unchanged, as the channel length increases, the magnitude of displacement of the silicon film 2 increases.

Therefore, in order to bring the transferred silicon film 2 into tight contact with the glass substrate 10 that is the receiver substrate, it is preferable to determine the thickness of the thermal oxide film 16 while taking into consideration the degree of warp of the silicon film 2 when the thermal oxide film 16 is formed on the surface of the silicon film 2.

The conditions under which the transferred silicon film 2 is brought into tight contact with the glass substrate 10 that is the receiver substrate change with not only the warp of the silicon film 2 but also other factors, which include, without limitation, the degree of the tight contact between the silicon film 2 and the receiver substrate 10, the type of the liquid interposed between the silicon film 2 and the flexible substrate 10, and the conditions of the heating process for evaporating the liquid in the state shown in FIG. 22B. Therefore, the conditions for the tight contact cannot be determined uniquely. Supposing that the magnitude of displacement of the silicon film 2 is set to be 50 nm or less, the thickness of the thermal oxide film 16 is suitably set to be 12 nm or less if the channel length is 5 µm, and to be 8 nm or less if the channel length is 10 µm.

In the forgoing description, the step of forming a thermal oxide film 16 on the surface of a silicon film 2 having a suspended structure is applied to the manufacturing process of a thin film transistor (a field-effect transistor), as an example. However, the present invention is not limited to this. The step of forming a thermal oxide film 16 on the surface of the yet-to-be-transferred silicon film 2 may be adopted in the process step of transferring the silicon film 2 onto the receiver substrate 10.

In the forgoing description, an SOI substrate is supposed to be used as the donor substrate. However, this is an example of the present invention. For example, a silicon substrate or a quartz substrate, of which the surface is covered with a polysilicon film with an insulating film sandwiched between the substrate and the film, may be used. A flexible substrate is supposed to be used as the receiver substrate in the forgoing description. However, this is an example of the present invention. For example, a quartz substrate, a glass substrate, a metallic foil substrate, or a wafer having integrated circuits may also be used.

Figure 29:
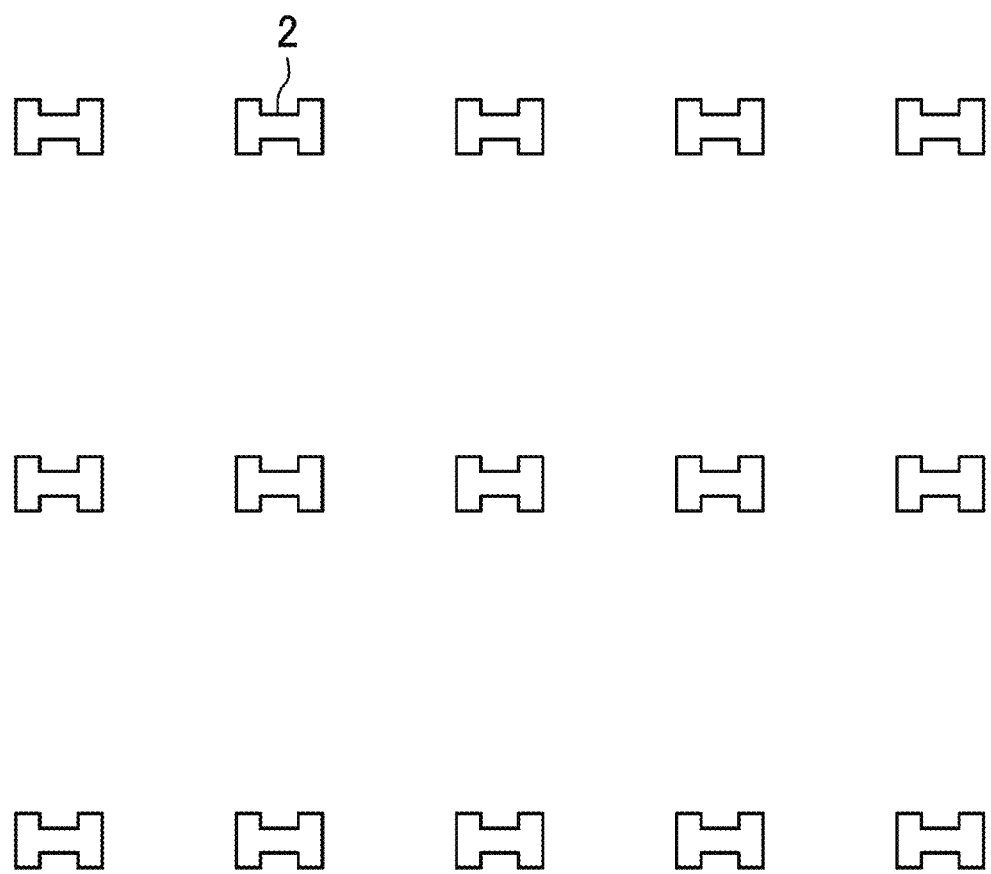
FIG. 29 is a plan view showing a matrix arrangement of patterns of a monocrystalline silicon film.

If a plurality of pattern elements, each having the pattern of the silicon film 2 shown in FIG. 20A, are arranged in a matrix as shown in FIG. 29, thin film transistors may be formed in a matrix on a flexible substrate or a glass substrate that is the receiver substrate. In FIG. 29, the openings 4 formed over the source/drain regions are not shown. By arranging interconnects for driving the thin film transistors, liquid crystal cells, and other members in the regions where the transistors are absent, a high-performance liquid crystal display device may be fabricated.

Figure 30A:
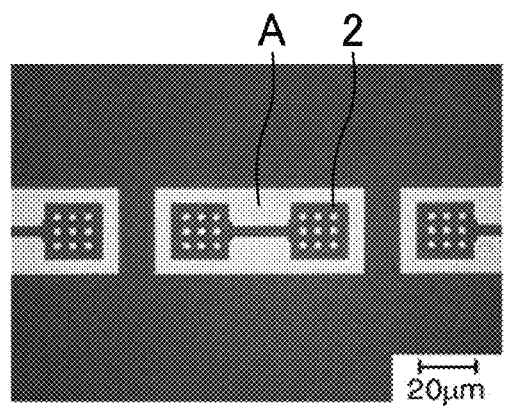
FIG. 30A is an optical micrograph showing yet-to-be-transferred patters of a monocrystalline silicon film.
Figure 30B:
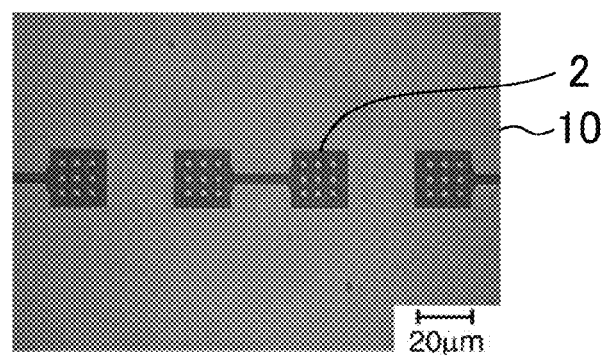
FIG. 30B is an optical micrograph showing the transferred patters of the monocrystalline silicon film.

FIG. 30A is an optical micrograph showing a state where a portion of each silicon film 2 has been removed from the region A surrounding the silicon film 2 with the pattern shown in FIG. 20A. In this manner, only the pattern of the silicon film 2 within the regions A is transferable onto the receiver substrate. FIG. 30B is an optical micrograph showing the pattern of the silicon film 2 transferred onto the glass substrate 10. As shown in FIG. 30B, only the pattern of the silicon film 2 formed within the regions A has been transferred onto the glass substrate 10.

Part of the silicon film 2 formed on the SOI substrate is transferable onto the glass substrate 10 as described above probably for the following reason. The rest of the silicon film 2 other than the portion located inside each region A is in contact with the insulating layer 3 over a large area. Therefore, the capillary adhesion force acting on the rest of the silicon film 2 outside each region A is smaller than the bonding force between the rest of the silicon film 2 outside each region A and the insulting layer 3. Consequently, only the portion of the silicon film 2 which is located inside each region A and on which the capillary adhesion force greater than the bonding force between the silicon film 2 and the pillars 3*a* acts would have been transferred onto the glass substrate 10.

Figure 31A:
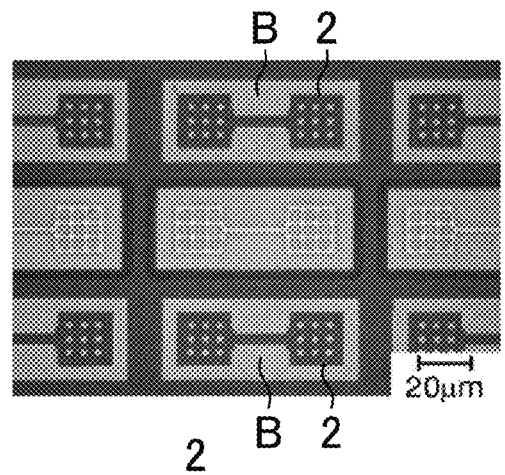
FIG. 31A is an optical micrograph showing yet-to-be-transferred patters of a monocrystalline silicon film.
Figure 31B:
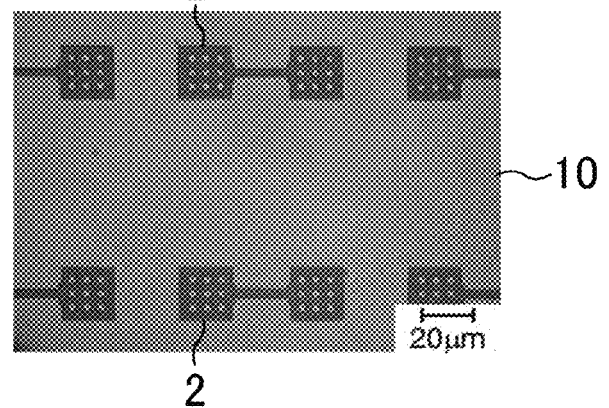
FIG. 31B is an optical micrograph showing the transferred patters of the monocrystalline silicon film.

FIG. 31A is an optical micrograph showing the pattern elements of the silicon film 2, each of which has been formed in an associated one of regions B of the rest of the silicon film 2 that remains even after the first transfer. FIG. 31B is an optical micrograph showing the patter of the silicon film 2 transferred onto a glass substrate 10. As can be seen from these photographs, since the portion remaining after the first transfer can be subsequently transferred, the silicon film 2 formed on an SOI substrate can be effectively used.

FIGS. 32A to 32E and 33A to 33D show respective process steps of a method for making an amorphous silicon thin film transistor by using a quartz substrate 1 having an amorphous silicon film 2 on its surface.

Figure 32A:
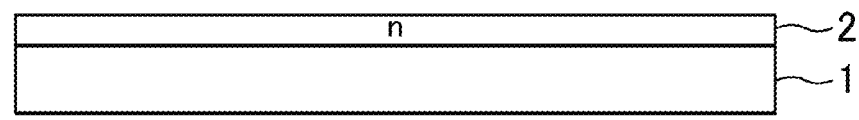
FIGS. 32A to 32E show respective process steps of a method for making an amorphous silicon thin film transistor.

First, as shown in FIG. 32A, an amorphous silicon film 2 doped with an n-type dopant is deposited on the surface of the quartz substrate 1. Alternatively, a quartz substrate 1, of which the surface is covered with an amorphous silicon film 2 doped with an n-type dopant, may be provided separately.

Figure 32B:
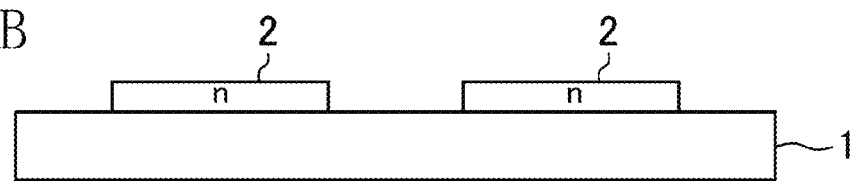

Next, as shown in FIG. 32B, the amorphous silicon film 2 is etched to form source/drain regions.

Figure 32C:
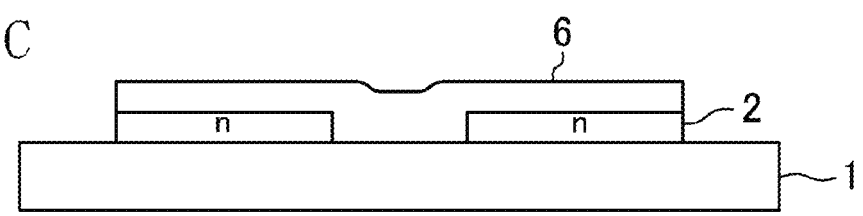

Next, as shown in FIG. 32C, an undoped amorphous silicon film 6 is deposited over the quartz substrate 1, and then patterned to form a channel region.

Figure 32D:
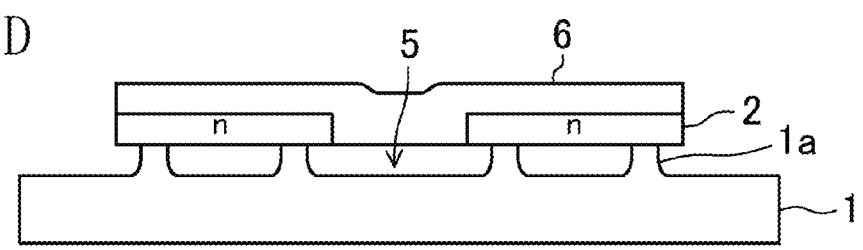

Subsequently, as shown in FIG. 32D, openings (not shown) are formed through the amorphous silicon films 2 and 6, and then, the quartz substrate 1 is isotropically etched with hydrofluoric acid through the openings, thereby forming a hollow portion 5 between the quartz substrate 1 and the amorphous silicon films 2 and 6. As a result, the amorphous silicon films 2 and 6 come to have a suspended structure supported by pillars 1*a* which have been left as a consequence of the etching of the quartz substrate 1.

Figure 32E:
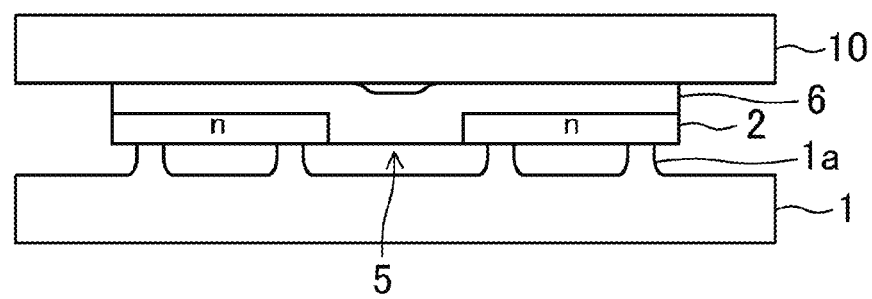

Thereafter, as shown in FIG. 32E, the amorphous silicon film 6 is brought into contact with a flexible substrate 10 with water (not shown) interposed between the film 6 and the substrate 10.

Figure 33A:
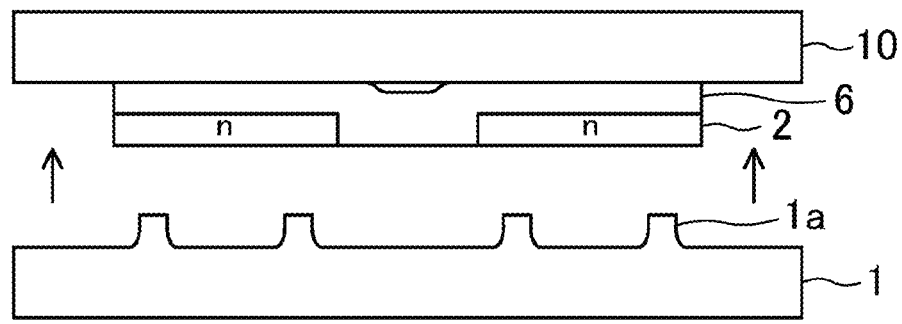
FIGS. 33A to 33D show respective process steps of the method for making the amorphous silicon thin film transistor.

Next, as shown in FIG. 33A, the quartz substrate 1 and/or the flexible substrate 10 are/is heated. As a result of this heating, the water interposed between the amorphous silicon film 6 and the flexible substrate 10 evaporates off, resulting in that the amorphous silicon films 2 and 6 are separated from the quartz substrate 1 and transferred onto the flexible substrate 10.

Figure 33B:
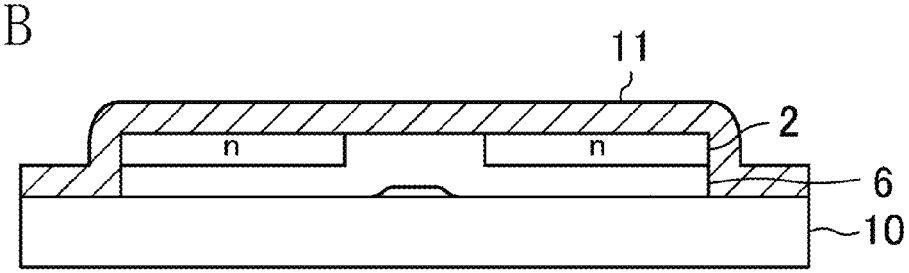

Then, as shown in FIG. 33B, a gate insulating film 11 is formed over the transferred amorphous silicon films 2 and 6. The gate insulating film 11 may be formed by applying a polysilazane solution or by deposition of a nitride film.

Figure 33C:
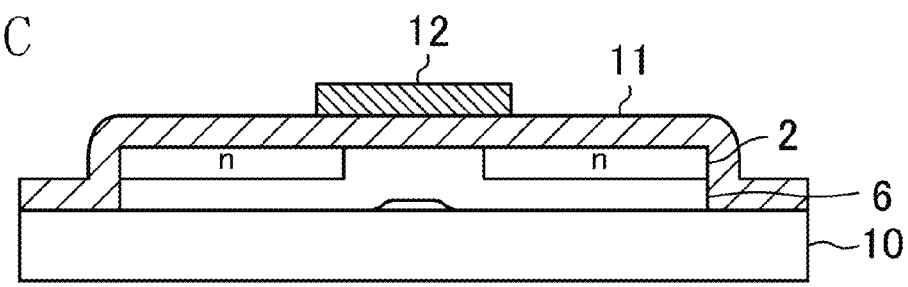

Next, as shown in FIG. 33C, a gate electrode 12 is formed on the gate insulating film 11. The gate electrode 12 may be formed by, for example, sputtering of aluminum, vapor deposition, or an inkjet process using metal nanoparticles.

Figure 33D:
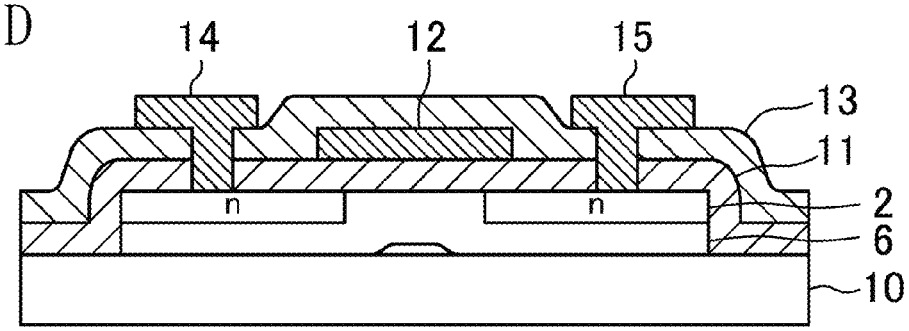

Finally, as shown in FIG. 33D, a protective film 13 is formed over the gate electrode 12, and then, holes are cut through the protective film 13 and the gate insulating film 11. Thereafter, source/drain electrodes 14 and 15 are formed to fill these holes. In this manner, a thin film transistor comprised of the amorphous silicon film is fabricated.

(2) Fabrication of Solar Cell

FIGS. 34A to 34D and 35A to 35E show respective process steps of a method for fabricating a solar cell by the thin film transfer technique of the present invention.

Figure 34A:
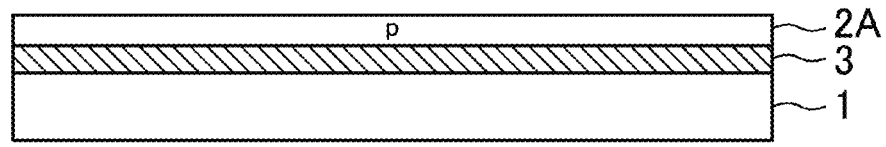
FIGS. 34A to 34D show respective process steps of a method for producing a solar cell by the thin film transfer technique of the present invention.

First, as shown in FIG. 34A, an SOI substrate is provided. The SOI substrate includes a silicon substrate 1, of which the surface is covered with a monocrystalline silicon film (hereinafter referred to simply as the "silicon film") 2A doped with a p-type dopant with a silicon dioxide film 3 sandwiched between the substrate 1 and the silicon film 2A.

Figure 34B:
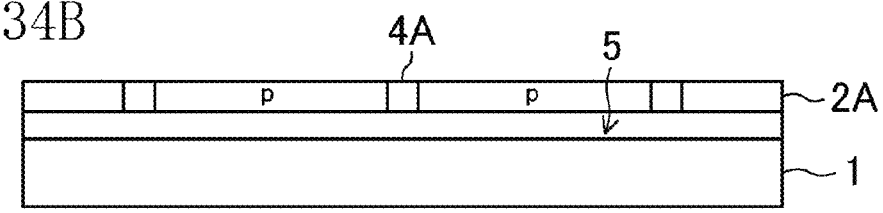

Next, as shown in FIG. 34B, openings 4A are formed through the p-type silicon film 2A, and then, the silicon dioxide film 3 is isotropically etched with hydrofluoric acid through the openings 4A, thereby forming a hollow portion 5 between the silicon substrate 1 and the p-type silicon film 2A.

As a result, the p-type silicon film 2A comes to have a suspended structure supported by pillars (not shown) which have been left as a consequence of the etching of the silicon dioxide film 3.

Figure 34C:
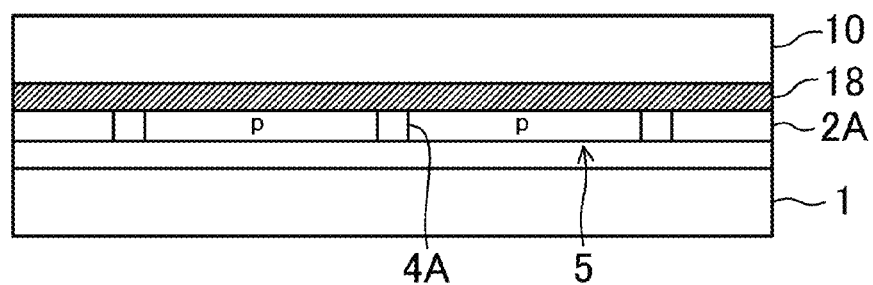

Subsequently, as shown in FIG. 34C, a flexible substrate 10 having a transparent electrode 18 on its surface is provided. The p-type silicon film 2A is then brought into contact with the transparent electrode 18 on the flexible substrate 10 with water (not shown) interposed between the p-type silicon film 2A and the transparent electrode 18.

Figure 34D:
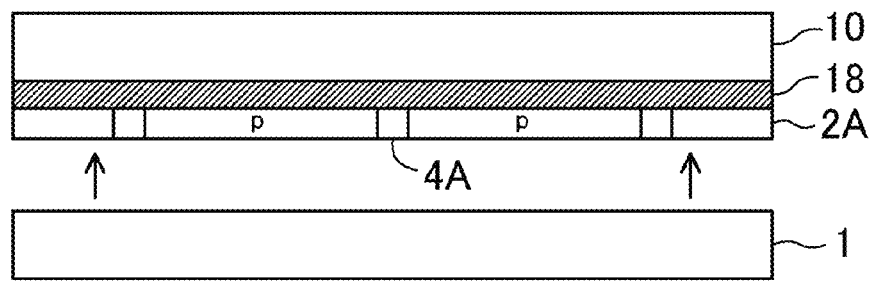

Next, as shown in FIG. 34D, the silicon substrate 1 and/or the flexible substrate 10 are/is heated. As a result of this heating, the water interposed between the p-type silicon film 2A and the transparent electrode 18 evaporates off, resulting in that the p-type silicon film 2A is separated from the silicon substrate 1 and transferred onto the flexible substrate 10.

Figure 35A:
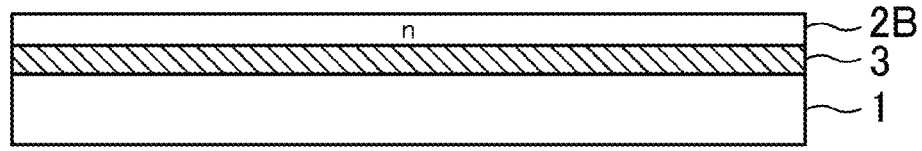
FIGS. 35A to 35E show respective process steps of the method for producing the solar cell by the thin film transfer technique of the present invention.

Thereafter, as shown in FIG. 35A, an SOI substrate including a silicon substrate 1, of which the surface is covered with a silicon film 2B doped with an n-type dopant, with a silicon dioxide film 3 sandwiched between the substrate 1 and the silicon film 2B, is provided.

Figure 35B:
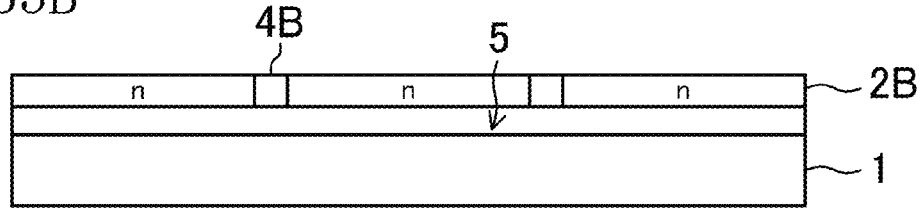

Next, as shown in FIG. 35B, openings 4B are formed through the n-type silicon film 2B, and then, the silicon dioxide film 3 is isotropically etched with hydrofluoric acid through the openings 4B, thereby forming a hollow portion 5 between the silicon substrate 1 and the n-type silicon film 2B. As a result, the n-type silicon film 2B comes to have a suspended structure supported by pillars (not shown) which have been left as a consequence of the etching of the silicon dioxide film 3.

Figure 35C:
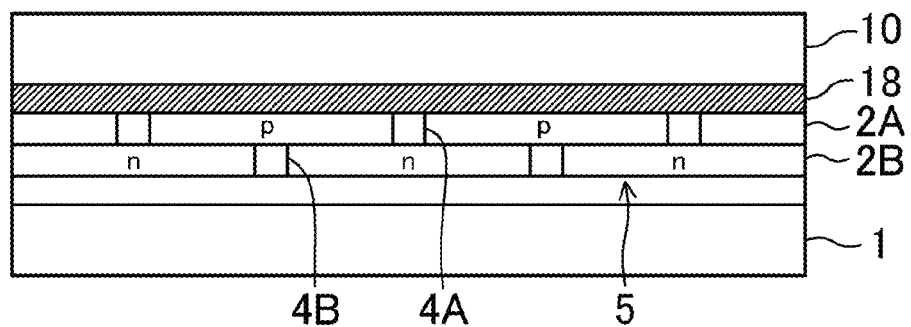

Then, as shown in FIG. 35C, the n-type silicon film 2B is brought into contact with the p-type silicon film 2A transferred onto the flexible substrate 10 with water (not shown) interposed between the films 2A and 2B. At this time, the films 2A and 2B are brought into contact with each other such that the openings 4A formed through the p-type silicon film 2A are not aligned with the openings 4B formed through the n-type silicon film 2B.

Figure 35D:
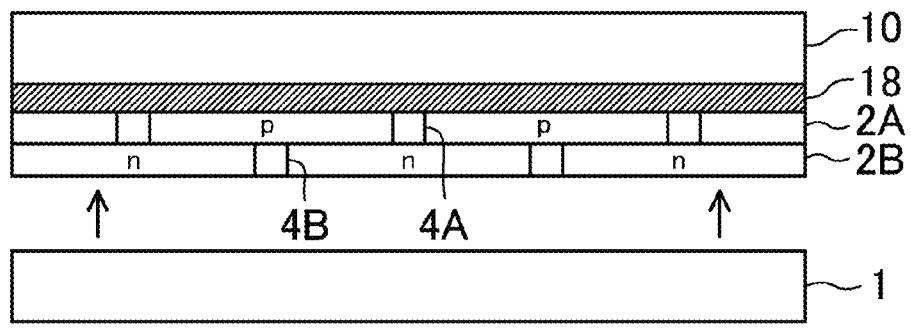

Subsequently, as shown in FIG. 35D, the silicon substrate 1 and/or the flexible substrate 10 are/is heated. As a result of this heating, the water interposed between the n-type silicon film 2B and the p-type silicon film 2A evaporates off, resulting in that the n-type silicon film 2B is separated from the silicon substrate 1 and transferred onto the p-type silicon film 2A.

Figure 35E:
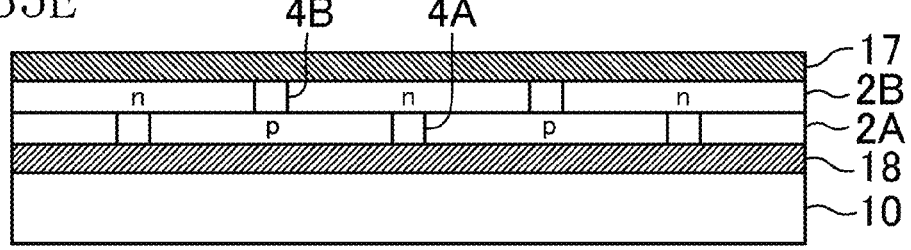

Next, as shown in FIG. 35E, an electrode 17 is deposited on the n-type silicon film 2B transferred. The electrode 17 may be formed by vapor deposition of aluminum, for example. Thus, a solar cell is fabricated which has a PN junction formed by the stack of the silicon films 2A and 2B over the flexible substrate 10.

In the forgoing description, an SOI substrate is supposed to be used as the donor substrate. However, this is an example of the present invention. For example, a silicon substrate or a quartz substrate, of which the surface is covered with a polysilicon film with an insulating film sandwiched between the substrate and the film, may also be used. A flexible substrate is supposed to be used as the receiver substrate in the forgoing description. However, this is an example of the present invention. For example, a glass substrate may also be used. Further, in order to increase the degree of closeness of contact between the silicon films 2A, 2B and the flexible substrate 10, the step of conducting a heat treatment on the flexible substrate 10, onto which the silicon films 2A and 2B have been transferred, may be added.

FIGS. 36A to 36E, 37A to 37D, and 38A to 38D show respective process steps of another method for producing a solar cell by the thin film transfer technique of the present invention.

Figure 36A:
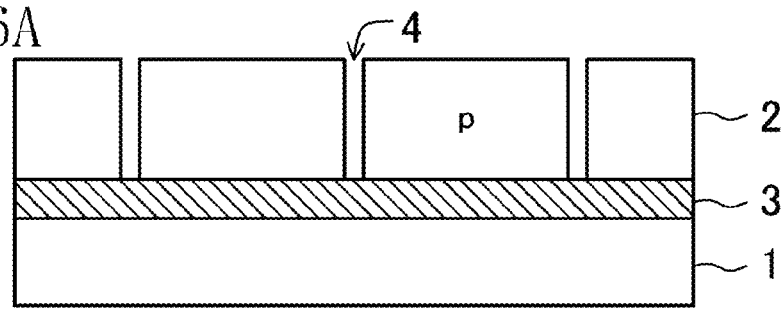
FIGS. 36A to 36E show respective process steps of another method for producing a solar cell by the thin film transfer technique of the present invention.

First, as shown in FIG. 36A, an SOI substrate is provided. The SOI substrate includes a silicon substrate 1, of which the surface is covered with a silicon film 2 doped with a p-type dopant with a silicon dioxide film 3 sandwiched between the substrate 1 and the silicon film 2. Thereafter, openings 4 are formed through the silicon film 2.

Figure 36B:
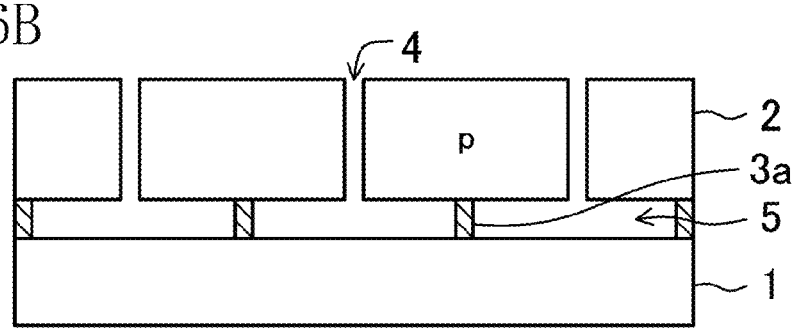

Next, as shown in FIG. 36B, the silicon dioxide film 3 is isotropically etched with hydrofluoric acid through the openings 4, thereby forming a hollow portion 5 between the silicon substrate 1 and the silicon film 2. As a result, the silicon film 2 comes to have a suspended structure supported by pillars 3a which have been left as a consequence of the etching of the silicon dioxide film 3.

Figure 36C:
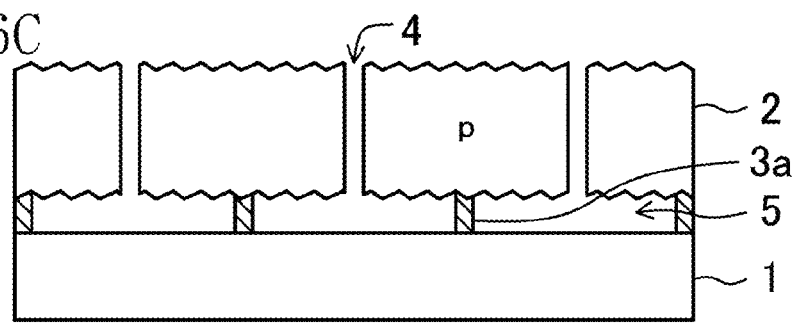

Subsequently, as shown in FIG. 36C, the front surface of the p-type silicon film 2 and the back surface of the p-type silicon film 2 facing the hollow portion 5 are subjected to texturing. This texturing may be performed by anisotropic etching with the use of trimethylanilinium hydroxide (TMAH), for example. In this manner, the back surface facing the hollow portion 5 is also textured.

Figure 36D:
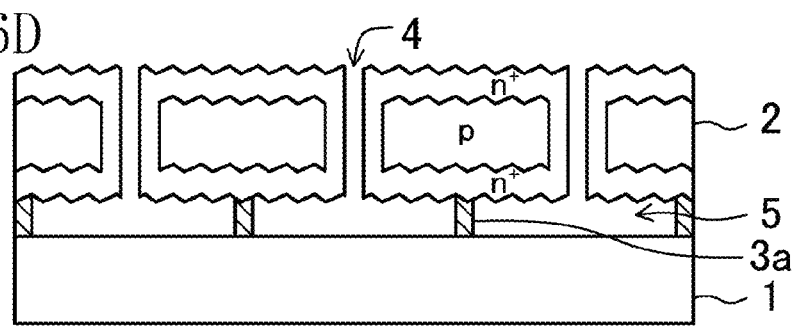

Next, as shown in FIG. 36D, an $n^+$ layer is formed on the surfaces of the p-type silicon film 2. The $n^+$ layer may be formed by heating the surfaces to which a phosphoric acid aqueous solution has been applied, for example. In this manner, since the phosphoric acid aqueous solution is introduced also into the openings 4 and the hollow portion 5, the inner walls of the openings 4 of the p-type silicon film 2 and the back surface facing the hollow portion 5 are also covered with the $n^+$ layer.

Figure 36E:
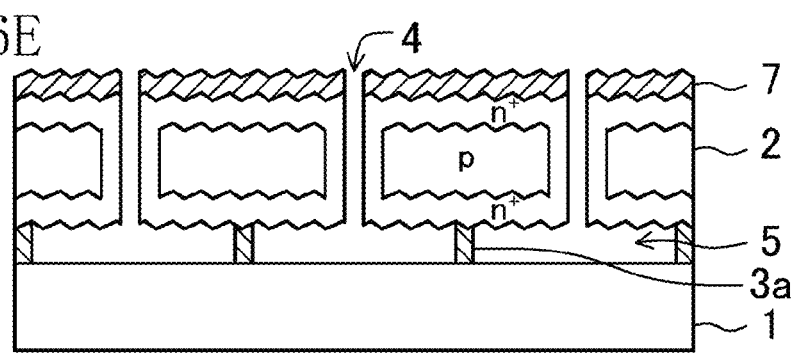

Thereafter, as shown in FIG. 36E, a silicon nitride film 7 is formed over the $n^+$ layer. The silicon nitride film 7 may be formed by plasma CVD, for example.

Figure 37A:
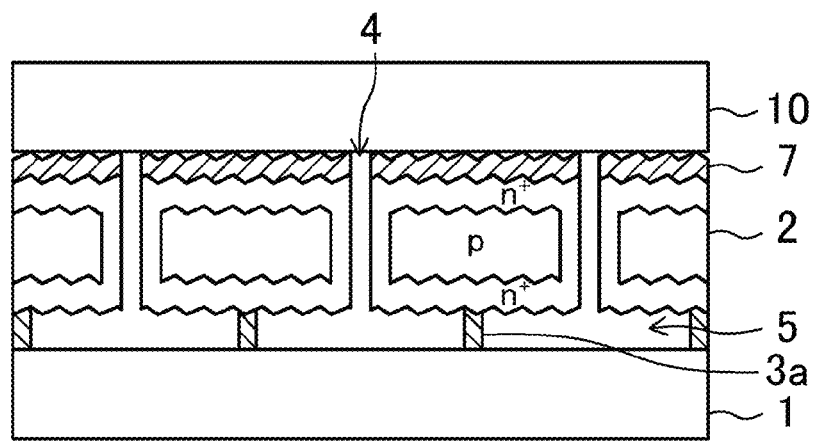
FIGS. 37A to 37D show respective process steps of another method for producing a solar cell by the thin film transfer technique of the present invention.

Next, as shown in FIG. 37A, the silicon nitride film 7 is brought into contact with a glass substrate 10 with water (not shown) interposed between the film 7 and the substrate 10.

Figure 37B:
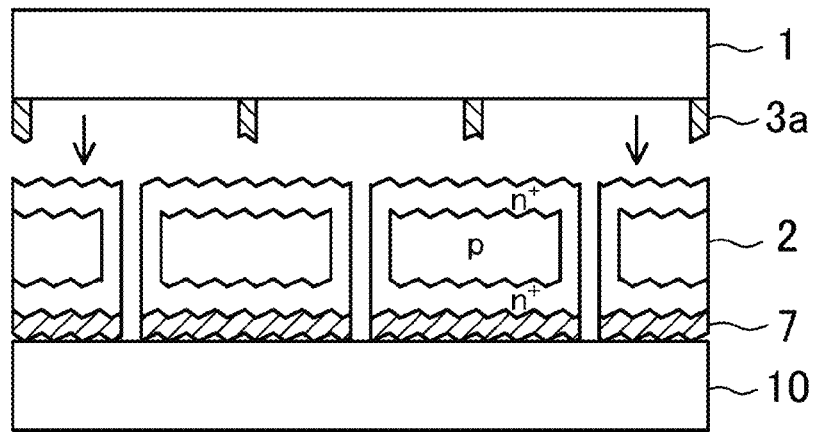

Then, as shown in FIG. 37B, the silicon substrate 1 and/or the glass substrate 10 are/is heated. As a result of this heating, the water interposed between the silicon nitride film 7 and the glass substrate 10 evaporates off, resulting in that the stack of the silicon film 2 and the silicon nitride film 7 is separated from the silicon substrate 1 and transferred onto the glass substrate 10.

Figure 37C:
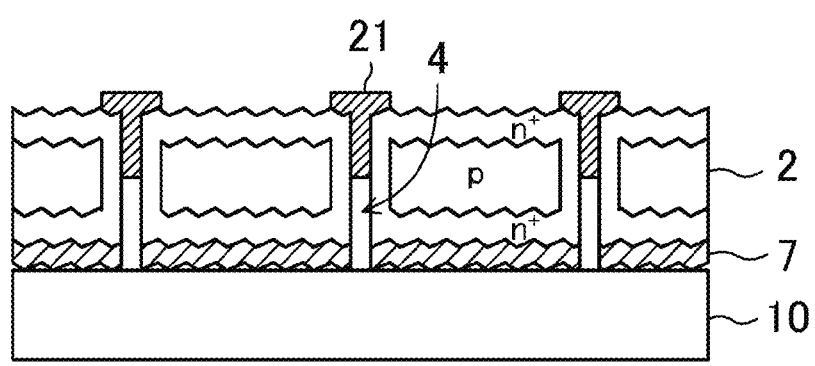

Next, as shown in FIG. 37C, the openings 4 are filled with Ag electrodes 21. The Ag electrodes 21 may be embedded by screen printing of an Ag paste.

Figure 37D:
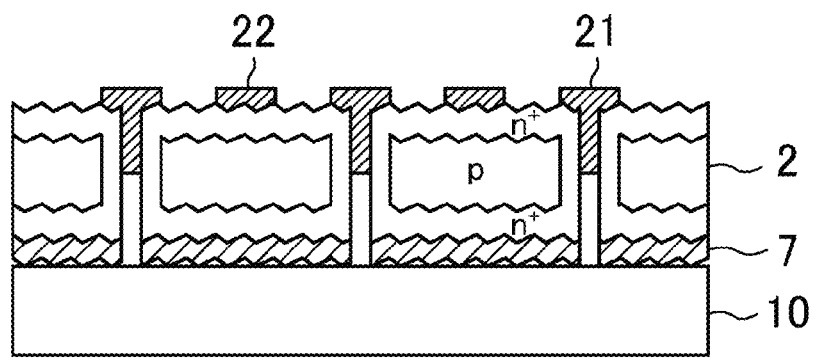

Subsequently, as shown in FIG. 37D, Al electrodes 22 are formed on the front surface of the $n^+$ layer. The Al electrodes 22 may be formed by applying a paste material containing aluminum powder with the use of, e.g., screen printing.

Figure 38A:
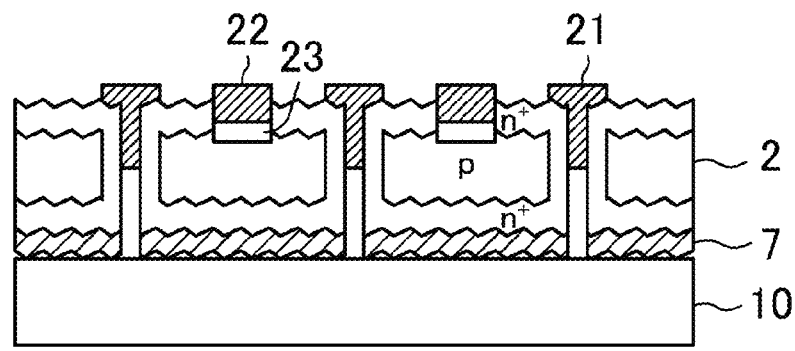
FIGS. 38A to 38D show respective process steps of another method for producing a solar cell by the thin film transfer technique of the present invention.

Thereafter, as shown in FIG. 38A, an aluminum paste is baked to diffuse aluminum in the $n^+$ layer, thereby forming a backsurface field (BSF) layer 23 between the Al electrodes 22 and the p-type silicon film 2.

Figure 38B:
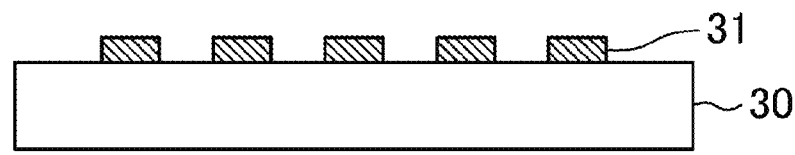
Figure 38C:
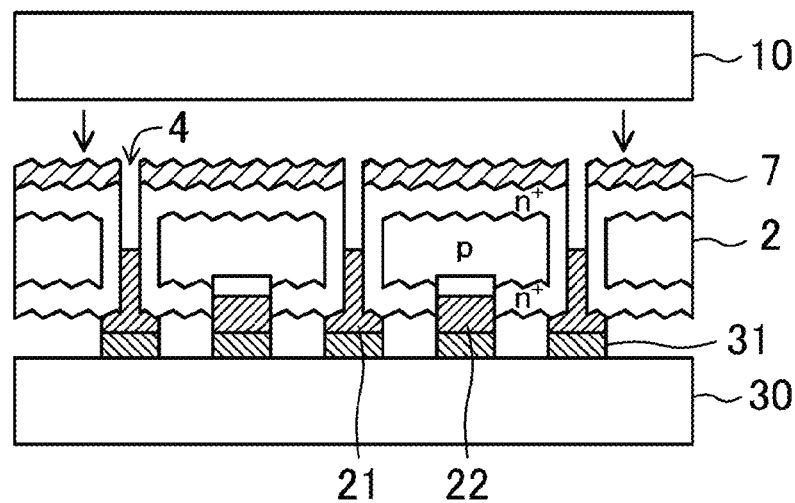

Next, as shown in FIG. 38B, a flexible substrate 30 having electrodes 31 on its surface is provided. Thereafter, as shown in FIG. 38C, with the use of an adhesive, the structure including a PN junction and formed on the glass substrate 10 is transferred onto the flexible substrate 30. At this time, each of the Ag electrodes 21 and the Al electrodes 22 is bonded to an associated one of the electrodes 31.

Figure 38D:
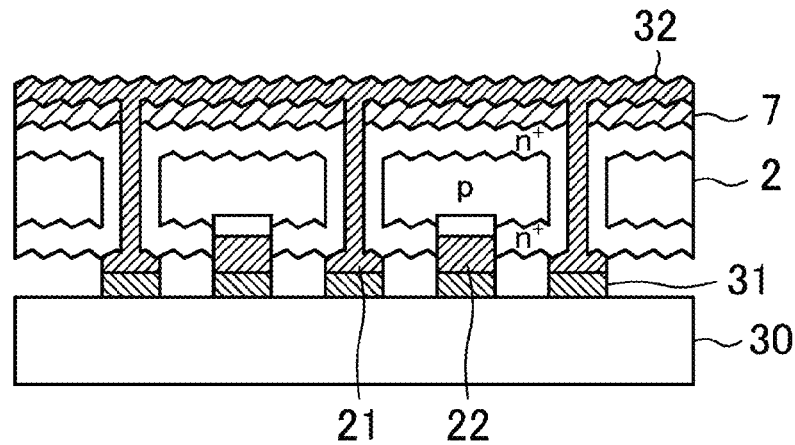

Finally, as shown in FIG. 38D, an Ag electrode 32 is formed over the silicon nitride film 7 such that the openings 4 are filled with the Ag electrode 32. In this manner, a solar cell is fabricated on the flexible substrate 30.

Methods for making electronic devices by the thin film transfer technique of the present invention have been described above. The electronic devices, however, are not limited to the thin film transistors and solar cells that have been described in the above application examples. The preset invention also is applicable to various electronic devices which include a thin film as a component.

What is claimed is:

1. A film forming method, comprising the steps of:
providing a first substrate, of which a surface is covered with a film;
forming a plurality of openings through the film;
forming a hollow portion between the first substrate and the film by etching the first substrate through the openings;
bringing the film into contact with a second substrate with a liquid interposed between the film and the second substrate; and
heating the first substrate and/or the second substrate, wherein
in the step of heating, the liquid interposed between the film and the second substrate evaporates off, which results in that the film is separated from the first substrate and transferred onto the second substrate.

2. The method of claim 1, wherein
the film and the first substrate sandwich therebetween a sacrificial layer,
the step of forming the hollow portion is performed by etching the sacrificial layer, instead of the first substrate, and
in the step of heating, the film is separated from the sacrificial layer and transferred onto the second substrate.

3. The method of claim 2, wherein
the first substrate is configured as an SOI substrate, and
the film is configured as a monocrystalline semiconductor film.

4. The method of claim 1, wherein
in the step of heating, the first substrate and/or the second substrate are/is heated such that the evaporation of the liquid progresses in one direction from an end portion of the substrates.

5. The method of claim 1, wherein
the step of heating is performed at a temperature lower than a boiling point of the liquid.

6. The method of claim 1, wherein
the liquid is water, ethanol, acetone, or polysilazane.

7. The method of claim 1, wherein
the second substrate is surface-treated so that its surface has an affinity for the liquid.

8. The method of claim 1, further comprising,
after the step of heating, a step of conducting a heat treatment on the second substrate on which the film has been transferred.

9. The method of claim 8, wherein
the second substrate is configured as a flexible substrate, and
the heat treatment is performed at a temperature equal to or higher than a glass transition temperature of the flexible substrate.

10. The method of claim 1, wherein
the film is configured as a silicon film, and
the method further comprises, after the step of forming the hollow portion and before the step of bringing the film into contact with the second substrate, a step of forming a thermal oxide film on a surface of the film.

11. The method of claim 1, wherein
in the step of forming the openings, the openings are arranged in an array or in a hound's tooth check.

12. The method of claim 1, wherein
the second substrate is configured as a flexible substrate, a quartz substrate, or a glass substrate.

13. A method for making a film transistor, the method comprising the steps of:
providing a first substrate of which a surface is covered with a semiconductor film with an insulating layer sandwiched between the first substrate and the semiconductor film;
patterning the semiconductor film into regions to serve as a channel region and source/drain regions;
forming a plurality of openings through the regions of the semiconductor film to serve as the source/drain regions;
forming a hollow portion between the first substrate and the semiconductor film by etching the insulating layer through the openings;
bringing the semiconductor film into contact with a second substrate with a liquid interposed between the semiconductor film and the second substrate; and
heating the first substrate and/or the second substrate, wherein
in the step of heating, the liquid interposed between the semiconductor film and the second substrate evaporates off, which results in that a pattern of the semiconductor film is separated from the insulating layer and transferred onto the second substrate.

14. The method of claim 13, further comprising:
after the step of patterning, a step of forming the source/drain regions by implanting a dopant into the regions to serve as the source/drain regions and then subjecting the regions to a heat treatment; and
after the step of heating, a step of forming a gate insulating film on the channel region of the semiconductor film that has been transferred onto the second substrate.

15. The method of claim 13, wherein
the semiconductor film is configured as a silicon film, and
the method further comprises, after the step of forming the hollow portion and before the step of bringing the semiconductor film into contact with the second substrate, the step of forming a thermal oxide film on a surface of the semiconductor film.

16. The method of claim 15, wherein
the thermal oxide film is used as a gate insulating film.

17. The method of claim 13, wherein
the second substrate is configured as a flexible substrate, a quartz substrate, or a glass substrate.

18. The method of claim 13, wherein
in the step of patterning the semiconductor film, the regions to serve as the channel regions and the source/drain regions are patterned in a matrix.

19. A method for producing a solar cell, the method comprising the steps of:
providing a second substrate which has a transparent electrode on a surface thereof; and
by the method of claim 1, transferring a first conductivity type semiconductor film and a second conductivity type semiconductor film in this order from the first substrate onto the second substrate; wherein
in the step of transferring, a PN junction is formed by the semiconductor films on the transparent electrode.

20. The method of claim 19, wherein
in the step of transferring, the semiconductor films are transferred such that a first opening formed through the first conductivity type semiconductor film is not aligned with a second opening formed through the second conductivity type semiconductor film.

21. The method of claim 19, further comprising:
after the step of transferring, a step of conducting a heat treatment on the second substrate.

22. The method of claim 19, wherein
the second substrate is configured as a flexible substrate, a quartz substrate, or a glass substrate.

\* \* \* \* \*